United States Patent
Xereas et al.

(10) Patent No.: US 12,338,119 B2
(45) Date of Patent: *Jun. 24, 2025

(54) DUAL-OUTPUT MICROELECTROMECHANICAL RESONATOR AND METHOD OF MANUFACTURE AND OPERATION THEREOF

(71) Applicant: Stathera IP Holdings Inc., Montreal (CA)

(72) Inventors: George Xereas, Montreal (CA); Vahid Tayari, Montreal (CA); Ahmed Khorshid, Montreal (CA); Charles Allan, Montreal (CA)

(73) Assignee: Stathera IP Holdings Inc., Montreal (CA)

( * ) Notice: Subject to any disclaimer, the term of this patent is extended or adjusted under 35 U.S.C. 154(b) by 0 days.

This patent is subject to a terminal disclaimer.

(21) Appl. No.: 18/608,595

(22) Filed: Mar. 18, 2024

(65) Prior Publication Data
US 2024/0253975 A1    Aug. 1, 2024

Related U.S. Application Data

(63) Continuation of application No. 18/165,118, filed on Feb. 6, 2023, now Pat. No. 11,932,530, which is a
(Continued)

(51) Int. Cl.
*B81B 3/00*    (2006.01)
*B81B 7/00*    (2006.01)
(Continued)

(52) U.S. Cl.
CPC .......... *B81B 3/0021* (2013.01); *B81B 7/0087* (2013.01); *H03H 9/02448* (2013.01);
(Continued)

(58) Field of Classification Search
CPC ................ B81B 3/0021; B81B 7/0087; H03H 9/02448; H03H 2009/2442; H03L 7/16; H03L 7/22
See application file for complete search history.

(56) References Cited

U.S. PATENT DOCUMENTS 7,755,441 B1    7/2010    Cioffi et al.
8,049,515 B2    11/2011    Schoen et al.
(Continued)

FOREIGN PATENT DOCUMENTS

EP    1217735 A1    6/2002
EP    1313216 A2    5/2003
WO    2016/185169    11/2016

OTHER PUBLICATIONS

PCT International Search Report and Written Opinion, PCT International Application No. PCT/IB2019/055529, dated Nov. 25, 2019, 12 pages.
(Continued)

*Primary Examiner* — Jeffrey M Shin
(74) *Attorney, Agent, or Firm* — Lee Sullivan Shea & Smith LLP

(57) ABSTRACT

An example resonating structure comprises a substrate, a resonator body, and an anchoring body for anchoring the resonator body to the substrate. The resonator body is doped with a dopant having a concentration chosen so as to minimize a second order temperature coefficient of frequency for the resonator body. The resonator body is operable in an in-plane mode of vibration and an out-of-plane mode of vibration.

20 Claims, 18 Drawing Sheets

Related U.S. Application Data continuation of application No. 17/716,340, filed on Apr. 8, 2022, now Pat. No. 11,584,635, which is a continuation of application No. 17/256,525, filed as application No. PCT/IB2019/055529 on Jun. 28, 2019, now Pat. No. 11,305,981.

(60) Provisional application No. 62/691,867, filed on Jun. 29, 2018.

(51) Int. Cl.
  *H03H 9/02* (2006.01)
  *H03H 9/24* (2006.01)

(52) U.S. Cl.
  CPC ............... *B81B 2201/0271* (2013.01); *H03H 2009/2442* (2013.01)

(56) References Cited

U.S. PATENT DOCUMENTS

| | | |
|---|---|---|
| 9,705,470 B1 | 7/2017 | Doll et al. |
| 9,905,748 B2 | 2/2018 | Nishimura et al. |
| 9,991,869 B2 | 6/2018 | Jaakkola et al. |
| 11,584,635 B2* | 2/2023 | Xereas .................... H03L 7/22 |
| 11,932,530 B2* | 3/2024 | Xereas .................... G01K 7/00 |
| 2007/0290764 A1 | 12/2007 | Partridge et al. |
| 2009/0056443 A1 | 3/2009 | Netzer |
| 2014/0086276 A1 | 3/2014 | Kishi et al. |
| 2019/0064749 A1 | 2/2019 | Sudo |

OTHER PUBLICATIONS

Li Ming-Huang et al., "Design and Characterization of a Dual-Mode CMOS-MEMS Resonator for TCF Manipulation". IEEE Journal of Microelectromechanical Systems, vol. 24, No. 2, Apr. 2015, 12 pages.

European Patent Office, Extended Search Report mailed on Mar. 14, 2022, issued in connection with European Application No. 19824776.9, 10 pages.

* cited by examiner

DUAL-OUTPUT MICROELECTROMECHANICAL RESONATOR AND METHOD OF MANUFACTURE AND OPERATION THEREOF

CROSS-REFERENCE TO RELATED APPLICATION

This application is a continuation of U.S. Application No. 18,165,118, filed Feb. 6, 2023, which is a continuation of U.S. application Ser. No. 17/716,340, filed Apr. 8, 2022, which is a continuation of U.S. application Ser. No. 17/256,525, filed Dec. 28, 2020, which is a national stage entry of Int'l Application No. PCT/IB2019/055529, filed Jun. 28, 2019, which claims priority to U.S. Provisional Application No. 62/691,867, filed Jun. 29, 2018. The foregoing applications are incorporated herein by reference in their entireties.

TECHNICAL FIELD

The present technology relates to the field of resonator devices, and more particularly to a dual-output microelectromechanical system (MEMS) resonator operable concurrently in an in-plane mode of vibration and an out of plane mode of vibration, and a method of operating and manufacturing the dual-output MEMS resonator.

BACKGROUND

Quartz crystal oscillators have been the foundation of timing and frequency reference applications for the past century. However, the advancement of electronics and recent paradigm shift to modern handheld devices has emphasized the limitations of the technology. The quartz fabrication process imposes physical limits in terms of performance, power consumption, robustness, size and Complementary Metal-Oxide Semiconductor (CMOS) compatibility. In order to meet modern requirements, researchers have been working on alternative frequency references at a feverish pace since the early 2000's.

During this period the Microelectromechanical Systems (MEMS) resonator has emerged as a promising candidate. Its technology relies on an silicon infrastructure that has been established to support the microfabrication of electronic chips. Generally speaking, these devices offer superior performance and set new standards in terms of integration, robustness and size in comparison with prior systems.

However, in practice, MEMS resonators are subject to frequency deviations that are caused by several phenomena, including temperature variation.

Contrary to quartz crystal oscillators, silicon MEMS resonator unfortunately do not have specific cuts that yield a lower temperature sensitivity. Thus, the turnover temperature cannot be controller easily. Additionally, due to silicon's highly negative temperature coefficient of elasticity (TCE), the resonant frequency of silicon resonators is strongly correlated to temperature with a negative slope of approximately −30 ppm/° C. This slope is typically referred to as the temperature coefficient of frequency (TCF) and to day remains one of the biggest challenges in commercializing silicon resonators. Researchers have attempted to address this challenge using different techniques.

These techniques may be classified in two broad categories that include passive compensation or active compensation. Passive compensation includes the fabrication of composite resonators (composed of two materials or more), and the use of ultra-high doping to reduce the temperature dependence. Active compensation approaches involve the use of electronics. In certain implementations an out-of-plane electrode is placed at a controlled voltage in order to exert a force on the MEMS resonator beam. The potential difference between the beam and the electrode induces an electrostatic force that is position dependent. The phenomenon is referred to as "spring softening" and can alter the resonant frequency of the silicon beam. The voltage on the out-of-plane electrode can be controlled by a feedback loop that includes a temperature sensor.

SUMMARY

Embodiments of the present technology have been developed based on inventor's appreciation that there is a need for a MEMS resonator that overcomes shortcomings of conventional resonators.

Among others, inventor(s) have appreciated that addition of external circuitry to the MEMS resonator to measure temperature consumes more power, takes more space, while not always having accurate measurements of the temperature, which could be used to compensate for the frequency deviations due to temperature.

Inventor(s) have appreciated that at least some MEMS resonator could be manufactured to be operated in at least two vibrations modes including an in-plane mode of vibration and out-of-plane mode of vibration, thereby providing two different frequencies, which could be used for different purposes, in a single package.

In some applications, such a dual mode MEMS resonator providing two frequencies could replace two resonators each providing a different frequency, while consuming less power than the two resonators, thus resulting in an economy of power and/or space.

Such a dual-mode MEMS resonator device could be adapted with circuitry to be controlled, to selectively output a first frequency, a second frequency, or the first and the second frequency concurrently.

Further, is it contemplated that such a dual-mode MEMS resonator could be connected to a circuit allowing to determine a temperature of the dual-mode MEMS resonator based on the two concurrently outputted frequencies, without requiring external temperature sensors, thus resulting in an economy of power, and being more accurate in some instances.

Moreover, the dual-mode MEMS resonator could be connected to additional components in a circuit that could be used for compensating for the temperature drifts based on the determined temperature, thereby providing more stables frequencies than some prior art systems.

The dual-mode MEMS device described herein could provide more accurate temperature measurements, and a more accurate count of time, which would allow its use in a variety of applications.

For example, a global navigation satellite system (GNSS) receiver generally requires two oscillators, and imposes limitations in size, vibration, shock, and performance. A dual-mode MEMS in accordance with embodiments of the present technology could replace two oscillators, which could save space, while also decreasing vibration, shock robustness, and/or vibration resistance.

Thus, embodiments of the present technology are directed to a dual-mode MEMS resonator. There is also provided a method of manufacturing a dual-mode MEMS resonator, a method and system of determining the temperature of a MEMS resonator, a method and system for operating a MEMS resonator, and a method and system for generating a compensated frequency signal for the MEMS resonator.

In accordance with a broad aspect of the present technology, there is provided a method for determining a temperature of a microelectromechanical systems (MEMS) resonator, the method comprising: operating the MEMS resonator in an in-plane mode of vibration using a first oscillator, thereby obtaining a first electrical signal having a first frequency. The method comprises concurrently operating the MEMS resonator in an out-of-plane mode of vibration using a second oscillator, thereby obtaining a second electrical signal having a second frequency being less than the first frequency, and mixing the first and second electrical signals together, thereby obtaining a third electrical signal having a third frequency, the third frequency being proportional to a temperature of the MEMS resonator. The method comprises determining a temperature of the MEMS resonator based on the third frequency of the third electrical signal, and outputting the determined temperature.

In one embodiment of the method, the MEMS resonator comprises a silicon resonator.

In one embodiment of the method, the silicon resonator comprises a bulk-mode silicon resonator.

In one embodiment of the method, the in-plane mode of vibration comprises one of a Lamé mode of vibration and a face-shear mode of vibration.

In one embodiment of the method, the out-of-plane mode of vibration comprises one of a second harmonic out-of-plane mode of vibration and a saddle mode of vibration.

In one embodiment of the method, the mixing the first and second electrical signals together comprises subtracting the second frequency from the first frequency.

In one embodiment of the method, the mixing the first and second electrical signals together comprises dividing the first frequency by the second frequency.

In one embodiment of the method, the step of determining the temperature of the MEMS resonator comprises applying a high-order polynomial function and a low-pass filter to the third electrical signal, thereby obtaining a fourth electrical signal indicative of the temperature.

In one embodiment of the method, the outputting the determined temperature comprises outputting the fourth electrical signal indicative of the determined temperature.

In accordance with another broad aspect of the present technology, there is provided a system for determining a temperature of a resonator. The system comprises a first oscillator electrically connectable to a microelectromechanical systems (MEMS) resonator for operating the MEMS resonator in an in-plane mode of vibration to obtain a first electrical signal having a first frequency. The system comprises a second oscillator electrically connectable to the MEMS resonator for operating, concurrently to an operation of the first oscillator, the MEMS resonator in an out-of-plane mode of vibration to obtain a second electrical signal having a second frequency being less than the first frequency. The system comprises a mixing unit for mixing the first and second electrical signals together to obtain a third electrical signal having a third frequency, the third frequency being proportional to a temperature of the MEMS resonator, and a temperature determining unit for determining a temperature of the MEMS resonator based on the third frequency of the third electrical signal and outputting the determined temperature.

In one embodiment of the system, the in-plane mode of vibration comprises one of a Lamé mode of vibration and a face-shear mode of vibration.

In one embodiment of the system, the out-of-plane mode of vibration comprises one of a second harmonic out-of-plane mode of vibration and a saddle mode.

In one embodiment of the system, the mixing unit is configured for subtracting the second frequency from the first frequency.

In one embodiment of the system, the mixing unit is configured for dividing the first frequency by the second frequency.

In one embodiment of the system, the temperature determining unit is configured for applying a high-order polynomial function and a low-pass filter to the third electrical signal, thereby obtaining a fourth electrical signal indicative of the temperature.

In one embodiment of the system, the temperature determining unit is configured for outputting the fourth electrical signal indicative of the determined temperature.

In one embodiment of the system, the MEMS resonator comprises one of a silicon resonator and a bulk-mode silicon resonator.

In one embodiment of the system, the system further comprises a PIN electrically connected to the system for selectively operating the MEMS resonator in at least one of the in-plane mode of vibration and the out-of-plane mode of vibration.

In accordance with another broad aspect of the present technology, there is provided a method for generating a temperature compensated frequency signal. The method comprises: operating a microelectromechanical systems (MEMS) resonator in an in-plane mode of vibration using a first oscillator, thereby obtaining a first electrical signal having a first frequency. The method comprises concurrently operating the MEMS resonator in an out-of-plane mode of vibration using a second oscillator, thereby obtaining a second electrical signal having a second frequency being less than the first frequency, mixing the first and second electrical signals together, thereby obtaining a third electrical signal having a third frequency, the third frequency being proportional to a temperature of the MEMS resonator. The method comprises determining the temperature of the MEMS resonator based on the third frequency of the third electrical signal, adjusting a value of at least one of the first frequency of the first electrical signal and the second frequency of the second electrical signal based on the determined temperature, thereby obtaining at least one temperature compensated frequency signal, and outputting the at least one temperature compensated frequency signal.

In one embodiment of the method, the MEMS resonator comprises a silicon resonator.

In one embodiment of the method, the silicon resonator comprises a bulk-mode silicon resonator.

In one embodiment of the method, the in-plane mode of vibration comprises one of a Lamé mode of vibration and a face-shear mode of vibration.

In one embodiment of the method, the out-of-plane mode of vibration comprises one of a second harmonic out-of-plane mode of vibration and a saddle mode of vibration.

In one embodiment of the method, the mixing the first and second electrical signals together comprises subtracting the second frequency from the first frequency.

In one embodiment of the method, the mixing the first and second electrical signals together comprises dividing the first frequency by the second frequency.

In one embodiment of the method, said determining the temperature of the MEMS resonator comprises applying a high-order polynomial function and a low-pass filter to the third electrical signal, thereby obtaining a fourth electrical signal indicative of the temperature.

In one embodiment of the method, said outputting the determined temperature comprises outputting the fourth electrical signal indicative of the determined temperature.

In one embodiment of the method, said adjusting comprises successively applying a delta-sigma modulation, a multi-modulus division and a fractional-N phase locked loop to the at least one of the first frequency of the first electrical signal and the second frequency of the second electrical signal based on the determined temperature.

In one embodiment of the method, said operating the MEMS resonator in the in-plane mode of vibration is performed selectively.

In one embodiment of the method, said operating the MEMS resonator in the in-plane mode of vibration is performed upon request.

In one embodiment of the method, said operating the MEMS resonator in the in-plane mode of vibration is performed at specific time intervals.

In accordance with another broad aspect of the present technology, there is provided a system for generating a temperature compensated frequency signal. The system comprises a first oscillator electrically connectable to a microelectromechanical systems (MEMS) resonator for operating the MEMS resonator in an in-plane mode of vibration to obtain a first electrical signal having a first frequency. The system comprises a second oscillator electrically connectable to MEMS resonator for operating, concurrently to an operation of the first oscillator, the MEMS resonator in an out-of-plane mode of vibration to obtain a second electrical signal having a second frequency being less than the first frequency. The system comprises a mixing unit for mixing the first and second electrical signals together, to obtain a third electrical signal having a third frequency, the third frequency being proportional to a temperature of the MEMS resonator. The system comprises a temperature determining unit for determining a temperature of the MEMS resonator based on the third frequency of the third electrical signal. The system comprises a compensation unit for adjusting a value of a one of the first frequency of the first electrical signal and the second frequency of the second electrical signal based on the determined temperature to obtain the temperature compensated frequency signal and outputting the temperature compensated frequency signal.

In one embodiment of the system, the MEMS resonator comprises a silicon resonator.

In one embodiment of the system, the silicon resonator comprises a bulk-mode silicon resonator.

In one embodiment of the system, the first oscillator is configured for operating the MEMS resonator in one of a Lamé mode of vibration and a face-shear mode of vibration.

In one embodiment of the system, the second oscillator is configured for operating the MEMS resonator in one of a second harmonic out-of-plane mode of vibration and a saddle mode of vibration.

In one embodiment of the system, the mixing unit is configured for subtracting the second frequency from the first frequency.

In one embodiment of the system, the mixing unit is configured for dividing the first frequency by the second frequency.

In one embodiment of the system, the temperature determining unit is configured for applying a high-order polynomial function and a low-pass filter to the third electrical signal, thereby obtaining a fourth electrical signal indicative of the temperature.

In one embodiment of the system, the temperature determining unit is configured for outputting the fourth electrical signal indicative of the determined temperature.

In one embodiment of the system, the compensation unit is configured for successively applying a delta-sigma modulation, a multi-modulus division and a fractional-N phase locked loop to the at least one of the first frequency of the first electrical signal and the second frequency of the second electrical signal based on the determined temperature.

In one embodiment of the system, the first oscillator is configured for selectively operating the MEMS resonator in the in-plane mode of vibration.

In one embodiment of the system, the first oscillator is configured for operating the MEMS resonator in the in-plane mode of vibration upon request.

In one embodiment of the system, the first oscillator is configured for operating the MEMS resonator in the in-plane mode of vibration at specific time intervals.

In accordance with another broad aspect of the present technology, there is provided a resonating structure comprising: a substrate, and a resonator body comprising a layer of base material and a layer of mismatch material deposited on top of the layer of base material, the base material being doped with a dopant having a concentration chosen so as to minimize a second order temperature coefficient of frequency for the resonator body, the mismatch material presenting a mismatch in temperature coefficient of elasticity (TCE) with the base material and a thickness of layer of the mismatch material being adequate for minimizing a first order temperature coefficient of frequency for the resonator body. The resonating structure comprises an anchoring body for anchoring the resonator body to the substrate.

In one embodiment of the resonating structure, the dopant comprises a p-type dopant.

In one embodiment of the resonating structure, the p-type dopant comprises one of boron, aluminum, gallium and indium.

In one embodiment of the resonating structure, the dopant is a n-type dopant.

In one embodiment of the resonating structure, the n-type dopant comprises one of phosphorus, arsenic, bismuth and lithium.

In one embodiment of the resonating structure, the concentration of the dopant is comprised between $10^{18}$ and $10^{21}$.

In one embodiment of the resonating structure, the mismatch material comprises silicon dioxide ($SiO_2$)

In one embodiment of the resonating structure, the mismatch material comprises undoped silicon.

In one embodiment of the resonating structure, the anchoring body comprises a tethering point located at a central vibration nodal point of the resonator body.

In one embodiment of the resonating structure, the anchoring body comprises four tethering points each located at a respective vibration nodal point of the resonator body.

In one embodiment of the resonating structure, the base material comprises one of Single Crystal Silicon, Silicon Carbide (SiC), Polycrystalline Silicon (Poly-Si), Quartz and Graphene and Polycrystalline Diamond.

In accordance with another broad aspect of the present technology, there is provided a method for fabricating a resonating structure. The method comprises providing a layer of base material, and doping the layer of base material with a dopant having a given concentration. The method comprises depositing a layer of mismatch material on top of the layer of base material, thereby obtaining a resonator body, the given concentration of dopant being chosen so as to minimize a second order temperature coefficient of frequency for the resonator body, the mismatch material presenting a mismatch in temperature coefficient of elasticity (TCE) with the single crustal silicon and a thickness of layer of the mismatch material being adequate for minimizing a first order temperature coefficient of frequency for the resonator body. The method comprises anchoring the resonator body to a substrate.

In one embodiment of the method, the dopant comprises a p-type dopant.

In one embodiment of the method, the p-type dopant comprises one of boron, aluminum, gallium and indium.

In one embodiment of the method, the dopant is a n-type dopant.

In one embodiment of the method, the n-type dopant comprises one of phosphorus, arsenic, bismuth and lithium.

In one embodiment of the method, the concentration of the dopant is comprised between $10^{18}$ and $10^{21}$.

In one embodiment of the method, the mismatch material comprises silicon dioxide ($SiO_2$).

In one embodiment of the method, the mismatch material comprises undoped silicon.

In one embodiment of the method, the anchoring the resonator body to the substrate comprises anchoring a tethering point located at a central vibration nodal point of the MEMS resonator body to the substrate.

In one embodiment of the method, the anchoring the resonator body to the substrate comprises anchoring to the substrate four tethering points each located at a respective vibration nodal point of the MEMS resonator body.

In one embodiment of the method, the depositing the layer of mismatch material on top of the layer of base material is performed using one of a Plasma-Enhanced Chemical Vapor Deposition (PECVD), a Low-Pressure Chemical Vapor Deposition (LPCVD) and a thermal growth.

In one embodiment of the method, said providing the layer of base material comprises providing a layer of one of Single Crystal Silicon, Silicon Carbide (SiC), Polycrystalline Silicon (Poly-Si), Quartz and Graphene and Polycrystalline Diamond.

In accordance with another broad aspect of the present technology, there is provided a method for selectively operating a resonator. The method comprises operating a MEMS concurrently in an in-plane mode of vibration and an out-of-plane mode of vibration, thereby obtaining a first electrical signal having a first frequency and a second electrical signal having a second frequency less than the first frequency, respectively, in response to receiving a control signal indicative of a desired single mode of vibration corresponding to one of the in-plane mode of vibration and the out-of-plane mode of vibration, the method comprises stopping the operation of the MEMS resonator in another one of the in-plane mode of vibration and the out-of-plane mode of vibration, thereby obtaining a single electrical signal corresponding to the one of the first electrical signal and the second electrical signal, and outputting the single electrical signal.

In one embodiment of the method, the operating the MEMS resonator in the in-plane mode of vibration comprises using a first oscillator electrically connected to the MEMS resonator, and wherein the operating the MEMS resonator in the out-of-plane mode of vibration comprises using a second oscillator electrically connected to the MEMS resonator.

In one embodiment of the method, the control signal is received from a controller electrically connected to at least one of the first oscillator and the second oscillator.

In one embodiment of the method, the method further comprises in response to receiving a command signal: stopping the operation of the MEMS resonator in another one of the one of the in-plane mode of vibration and the out-of-plane mode of vibration.

In one embodiment of the method, the method further comprises in response to receiving a command signal indicative of a desired mode of vibration of the MEMS resonator, operating the MEMS resonator in at least one of the: the in-plane mode of vibration using the first oscillator thereby obtaining the first electrical signal having the first frequency, and the out-of-plane mode of vibration using the second oscillator, thereby obtaining the second electrical signal having the second frequency.

In accordance with another broad aspect of the present technology, there is provided a system for operating a microelectromechanical systems (MEMS) resonator. The system comprises a first oscillator electrically connectable to the MEMS resonator for operating the MEMS resonator in an in-plane mode of vibration to obtain a first electrical signal having a first frequency. The system comprises a second oscillator electrically connectable to MEMS resonator for operating, concurrently to an operation of the first oscillator, the MEMS resonator in an out-of-plane mode of vibration to obtain a second electrical signal having a second frequency being less than the first frequency, and a controller in communication with the first oscillator and the second oscillator for controlling the first oscillator and the second oscillator to operate the MEMS resonator in at least one of the in-plane mode of vibration and the out-of-plane mode of vibration.

In one embodiment of the system, the MEMS resonator comprises a silicon resonator.

In one embodiment of the system, the silicon resonator comprises a bulk-mode silicon resonator.

In one embodiment of the system, the first oscillator is configured for operating the MEMS resonator in one of: a Lame mode of vibration, and a face-shear mode of vibration.

In one embodiment of the system, the second oscillator is configured for operating the MEMS resonator in one of: a second harmonic out-of-plane mode of vibration, and a saddle mode of vibration.

In one embodiment of the system, the controller is configured for controlling the first oscillator and the second oscillator via one of: a frequency select (FS) PIN, and an output enable (OE) PIN.

In one embodiment of the system, the controller is configured for controlling the first oscillator and the second oscillator by transmitting a control signal.

In one embodiment of the system, the controller is a microcontroller.

In accordance with another broad aspect of the present technology, there is provided a system comprising: a MEMS resonator, a first oscillator electrically connectable to the MEMS resonator for operating the MEMS resonator in an in-plane mode of vibration to obtain a first electrical signal having a first frequency. The system comprises a second oscillator electrically connectable to MEMS resonator for operating, concurrently to an operation of the first oscillator, the MEMS resonator in an out-of-plane mode of vibration to obtain a second electrical signal having a second frequency being less than the first frequency. The system comprises a controller in communication with the first oscillator and the second oscillator for controlling the first oscillator and the second oscillator to operate the MEMS resonator in at least one of the in-plane mode of vibration and the out-of-plane mode of vibration.

BRIEF DESCRIPTION OF THE DRAWINGS

Further features and advantages of the present technology will become apparent from the following detailed description, taken in combination with the appended drawings, in which.

It will be noted that throughout the appended drawings, like features are identified by like reference numerals.

DETAILED DESCRIPTION

Figure 1:
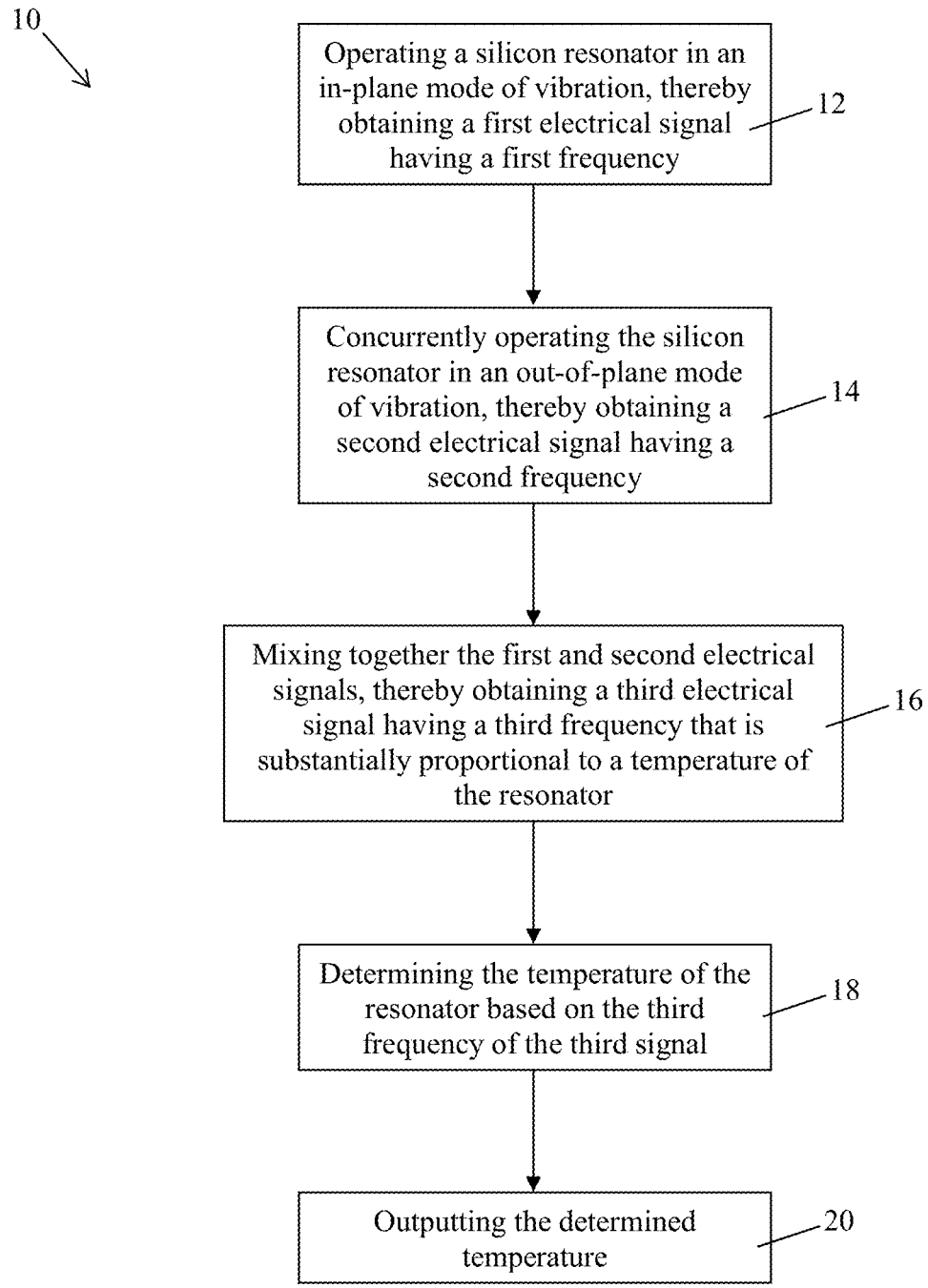
FIG. 1 is a flow chart of a method for determining the temperature of a MEMS resonator, in accordance with an embodiment.

FIG. 1 illustrates one embodiment of a method 10 for determining the temperature of a MEMS resonator. The MEMS resonator may be a silicon resonator such as a bulk-mode silicon resonator.

At step 12, the MEMS resonator is operated in an in-plane mode of vibration using a first oscillation circuit or oscillator electrically connected to the MEMS resonator. A first electrical signal having a first frequency is then generated by the MEMS resonator.

In one embodiment, the in-plane mode of vibration is the Lamé mode of vibration of the MEMS resonator. In another embodiment, the in-plane mode of vibration is the face-shear mode of vibration of the MEMS resonator, also known as the Wine-Glass mode of vibration.

At step 14, the MEMS resonator is operated in an out-of-plane mode of vibration using a second oscillation circuit or oscillator electrically connected to the MEMS resonator. A second electrical signal having a second frequency different from the first frequency is then generated by the MEMS resonator. It should be understood that the steps 12 and 14 are performed concurrently so that the MEMS resonator generates the first and second signal concurrently.

In one embodiment, the first frequency of the first electrical signal is greater than the second frequency of the second electrical signal.

In one embodiment, the out-of-plane mode of vibration is the second harmonic out-of-plane mode of vibration of the MEMS resonator. In another embodiment, the out-of-plane mode of vibration comprises the saddle mode of vibration of the MEMS resonator.

It should be noted that the transduction mechanism used to operate MEMS resonator in the in-plane mode of vibration and the out-of-plane mode of vibration is not limited and may include one of: a capacitive transduction mechanism, a piezoelectric transduction mechanisms, a thermal/piezoresistive transduction mechanism and the like.

At step 16, the first and second electrical signals generated at steps 12 and 14 are mixed together to obtain a third electrical signal having a third frequency that is different from the first and second frequencies and substantially proportional to the temperature of the MEMS resonator.

In one embodiment, the second frequency is subtracted from the first frequency to obtain the third frequency during the signal mixing performed at step 16. In one embodiment, the second frequency multiplied by a given factor is subtracted from the first frequency to obtain the third frequency at step 16.

In another embodiment, the first frequency is divided by the second frequency to obtain the third frequency during the signal mixing performed at step 16. In one embodiment, the first frequency is divided by the second frequency multiplied by a given factor to obtain the third frequency at step 16.

At step 18, the temperature of the MEMS resonator is determined using the third electrical signal and based on the third frequency. The determined temperature is outputted at step 20. The output is an electrical signal indicative of the determined temperature. In one embodiment, the amplitude of the output electrical signal is indicative of the determined temperature of the MEMS resonator. In another embodiment, the frequency of the output electrical signal is indicative of the determined temperature of the MEMS resonator.

In one embodiment, the step 18 consists in applying successively a high-order polynomial function and a low-pass filter to the third electrical signal, thereby obtaining the output electrical signal indicative of the temperature of the MEMS resonator.

In one embodiment, the MEMS resonator is a single crystal silicon (SCS) square bulk-mode resonator that is anchored to a substrate at its four nodal corner points. In this case, the SCS square bulk resonator may be operated in the Lamé mode of vibration $f_A$ (e.g. 9.46 MHz) and in the second harmonic out-of-plane mode of vibration $f_B$ (e.g. 587 kHz). Alternatively, the MEMS resonator may be operated in the face-shear mode of vibration $f_A$ (e.g., 8.35 MHZ) and in saddle mode of vibration $f_B$ (e.g., 862 kHz). It should be noted that four combinations of the in-plane and out-of-plane modes of vibration are possible:

Lame mode at 9.46 MHz and saddle mode at 862 kHz;

Lame mode at 9.46 MHz and 2nd harmonic out of place at 587 kHz;

Face-shear mode at 8.35 MHz and saddle mode at 862 kHz; and

Face-shear mode at 8.35 MHz and 2nd harmonic mode out-of-place at 587 kHz.

Figure 2A:
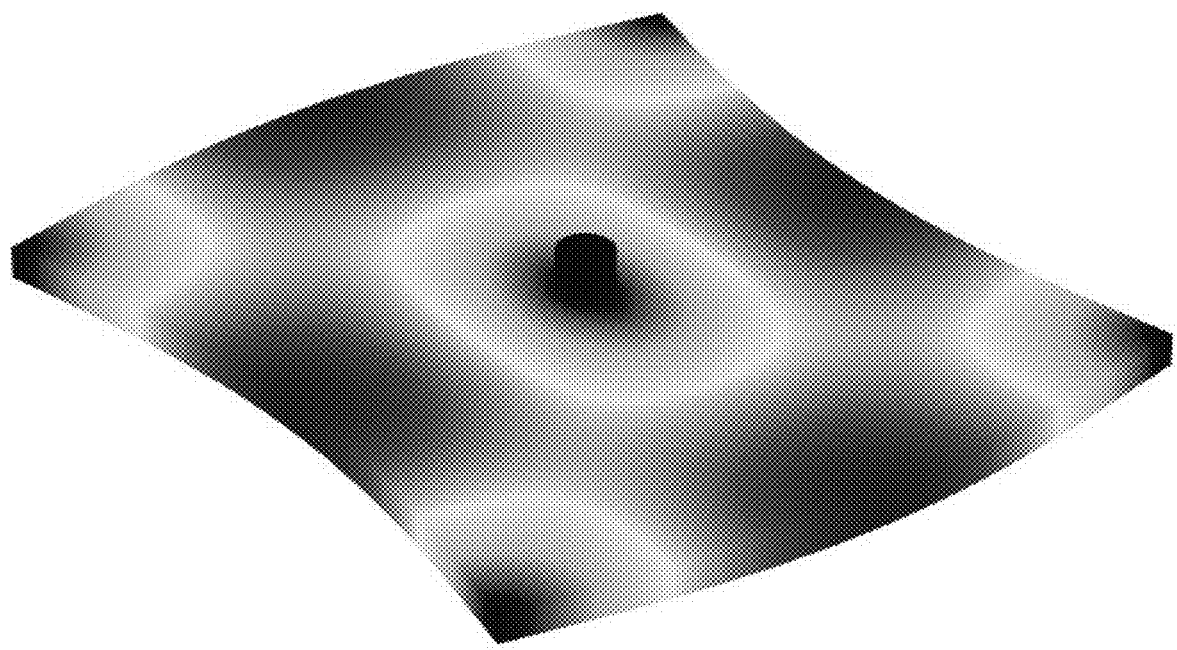
FIGS. 2A, 2B, 2C, and 2D illustrate exemplary modal shapes for an in-plane Lamé mode of vibration, an in-plane face-shear mode of vibration, and an out-of-plane saddle mode of vibration, and an out-of-plane second harmonic mode of vibration, respectively, for a MEMS resonator.
Figure 2B:
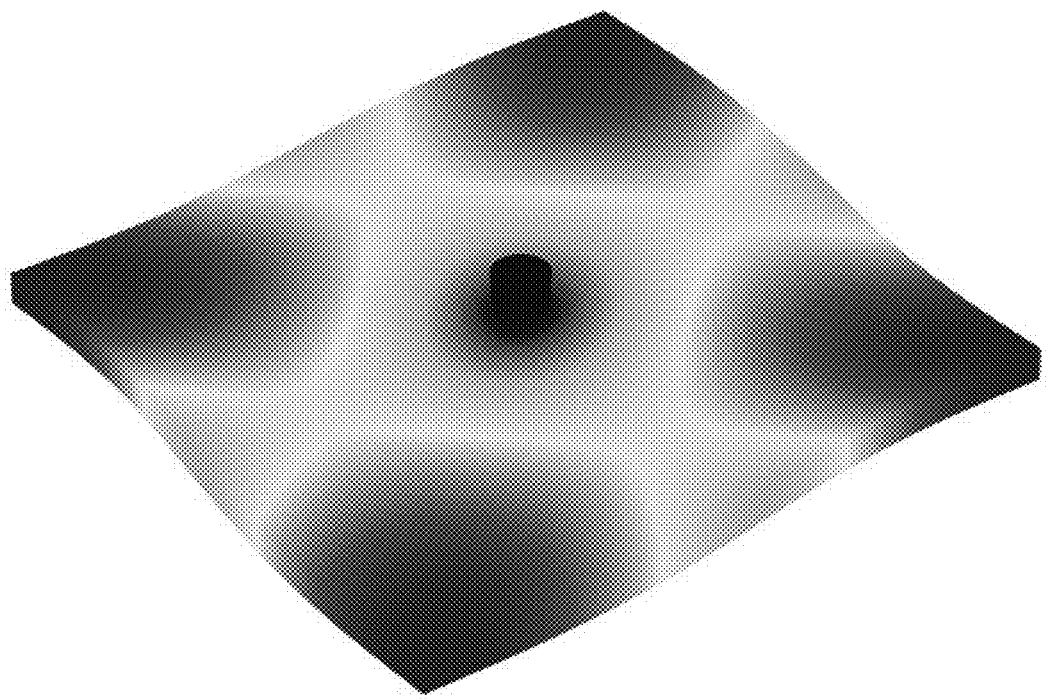
Figure 2C:
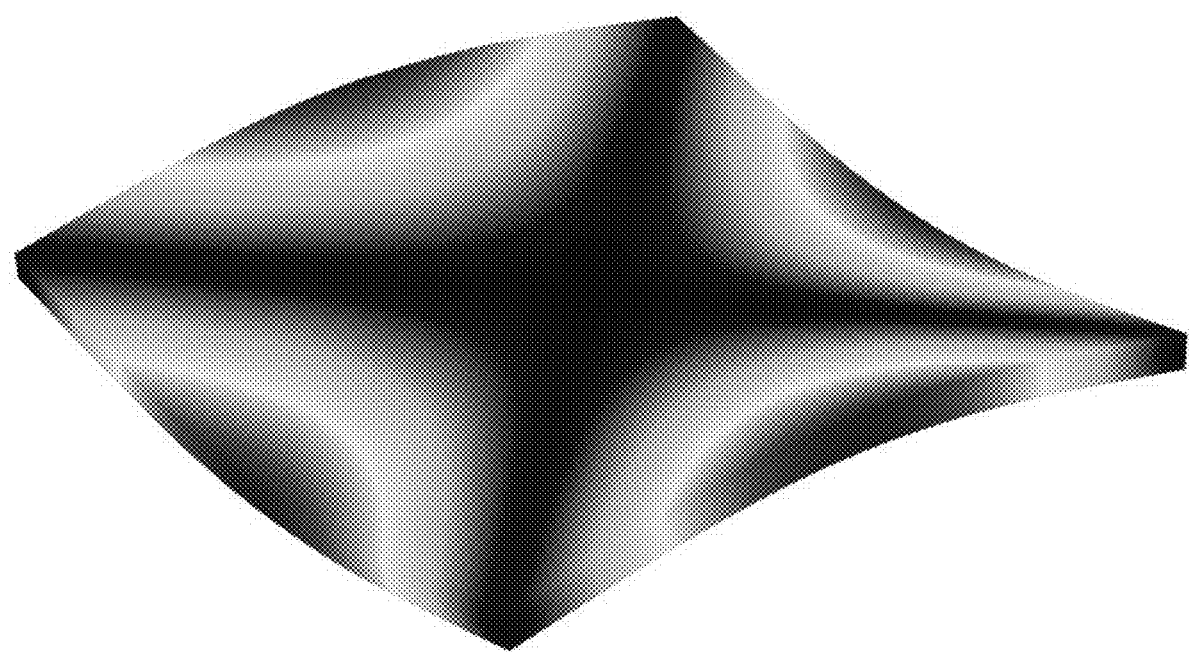
Figure 2D:
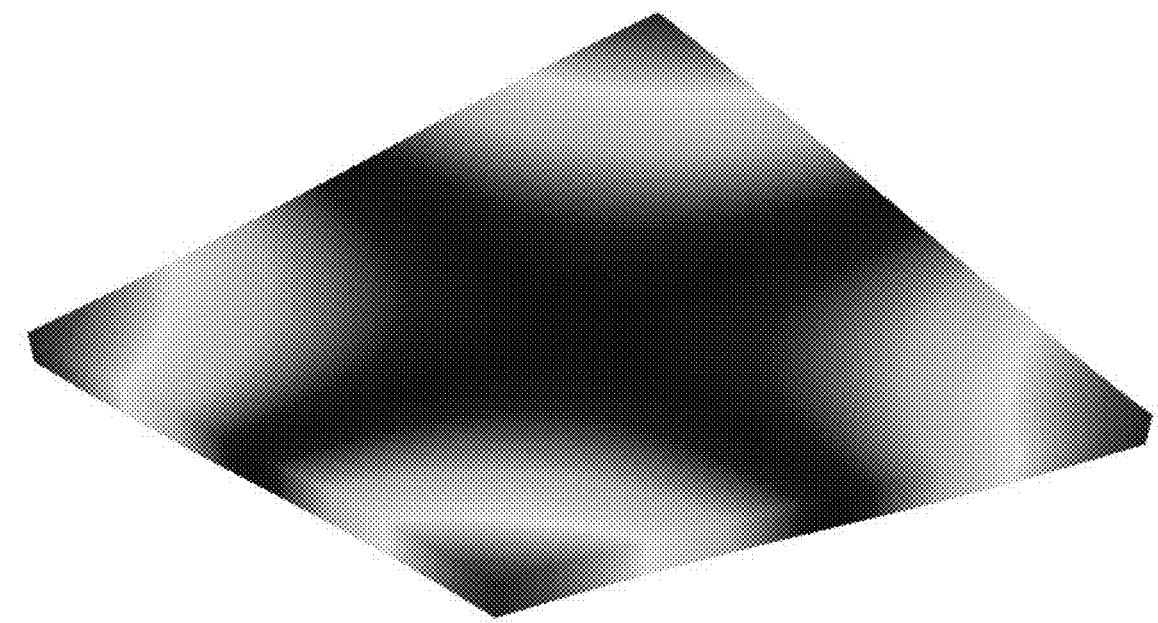

In another embodiment, the SCS square bulk-mode resonator is anchored to the substrate at its central nodal point. In this case, the Lamé mode of vibration $f_A$ (illustrated in FIG. 2a) is used to produce a high spectral purity signal (e.g. at 13 MHz) while the second harmonic out-of-plane mode of vibration $f_B$ (illustrated in FIG. 2b) is used to provide a low power and low frequency reference (e.g. 32.768 kHz). The eigenfrequencies of the Lame and second harmonic modes of vibration are far from each other. Therefore, there is substantially no modal interaction between the two modes of vibration that could negatively affect the phase noise performance.

For a silicon resonator, the resonant frequency temperature dependence is typically dominated by the first and second order coefficients and may be expressed as follows:

$$f(T) = f_o[TCF_1 * (\Delta T) + TCF_2 * (\Delta T)^2]$$

where $TCF_1$ and $TCF_2$ are the first order and second order temperature coefficient of frequency, respectively, and $\Delta T$ is a temperature variation.

In terms of fractional frequency change, the temperature behavior of the Lamé mode of vibration and the out-of-plane second harmonic mode of vibration may be respectively expressed as follows:

$$\frac{\Delta f}{f_A} = TCF_{A1} * (\Delta T) + TCF_{A2} * (\Delta T)^2$$

$$\frac{\Delta f}{f_B} = TCF_{B1} * (\Delta T) + TCF_{B2} * (\Delta T)^2$$

where $TCF_{A1}$ and $TCF_{A2}$ are the first and second order temperature coefficients of frequency, respectively, for the in-lane mode of vibration, i.e. the Lame mode of vibration, and the $TCF_{B1}$ and $TCF_{B2}$ are the first and second order temperature coefficients of frequency, respectively, for the out-of-lane mode of vibration, i.e. the second harmonic mode of vibration.

Figure 3:
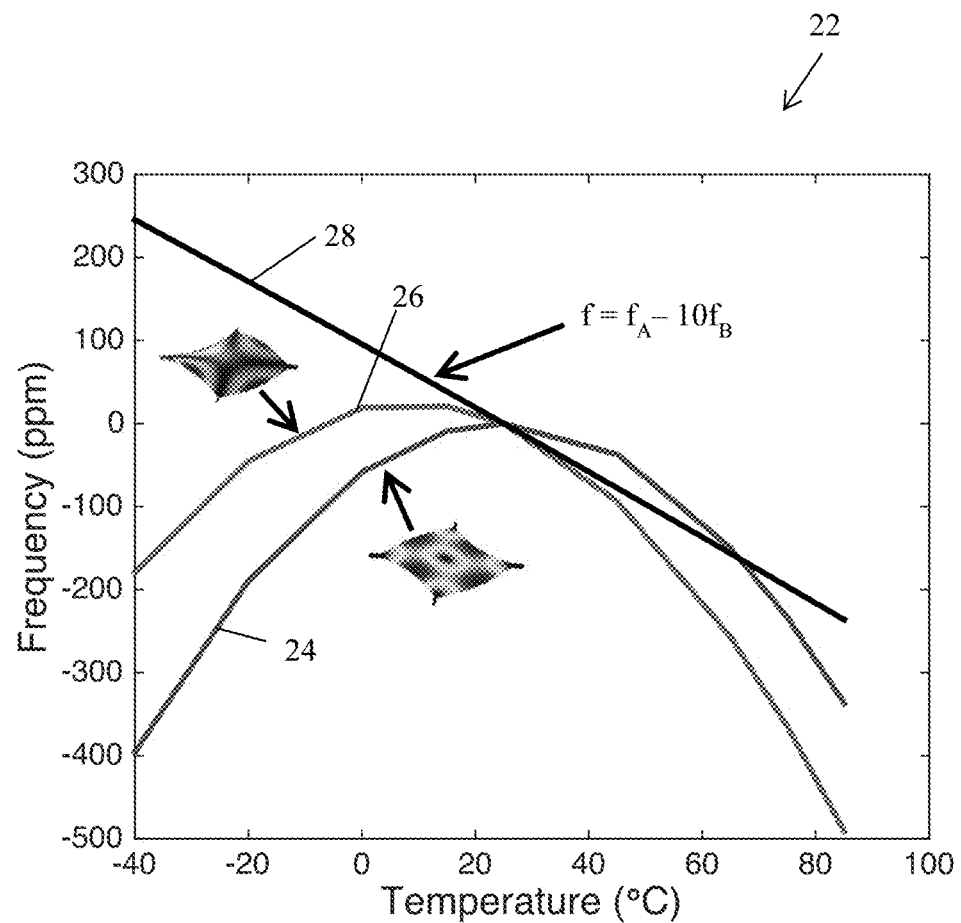
FIG. 3 is an exemplary graph of a fractional frequency change as a function of temperature for a Lamé mode of vibration ($f_A$), an out-of-plane mode of vibration ($f_B$), and $f_{beat} = f_A - 10 f_B$.

FIG. 3 illustrates a non-limiting example of a graph 22 of frequency (ppm) as a function of the temperature (C) for the MEMS resonator, comprising the Lamé mode of vibration function 24 and the second harmonic mode of vibration function 26 of the MEMS resonator, as well as the fractional frequency function 28, which has been computed based on the Lamé mode of vibration function 24 and the second harmonic mode of vibration function 26 of the MEMS resonator. As illustrated, the temperature sensitivities are highly non-linear with a turnover temperature (TOT) located at approximately 15° C. and 25° C., respectively. The Lamé mode of vibration mode and the second harmonic mode of vibration modes are designed so as to have different temperature coefficients of frequency $TCF_A$ and $TCF_B$.

When the mixing step 16 is applied to the first and second electrical signal, the resulting signal has a frequency $f_{beat}$ which is dominated by the difference between the first order temperature coefficients $TCF_{A1}$ and $TCF_{B1}$. The second order temperature coefficients $TCF_{A2}$ and $TCF_{B2}$ are designed to be cancelled out during processing.

In one embodiment, the frequency $f_{beat}$ is chosen so as to be equal to $f_A$ minus $10 \times f_B$. As illustrated in FIG. 3, $f_{beat}$ is then linear and strongly correlated to temperature, i.e. substantially proportional to the temperature. As a result, the output or third electrical signal having the frequency $f_{beat}$ is indicative of the temperature of the MEMS resonator.

In another embodiment, the frequency $f_{beat}$ is chosen so as to be equal to $f_A$ divided by $10 \times f_B$. In this case, $f_{beat}$ is also linear and correlated to temperature, i.e. substantially proportional to the temperature, and the output electrical signal having the frequency $f_{beat}$ is indicative of the temperature of the MEMs resonator.

Figure 4:
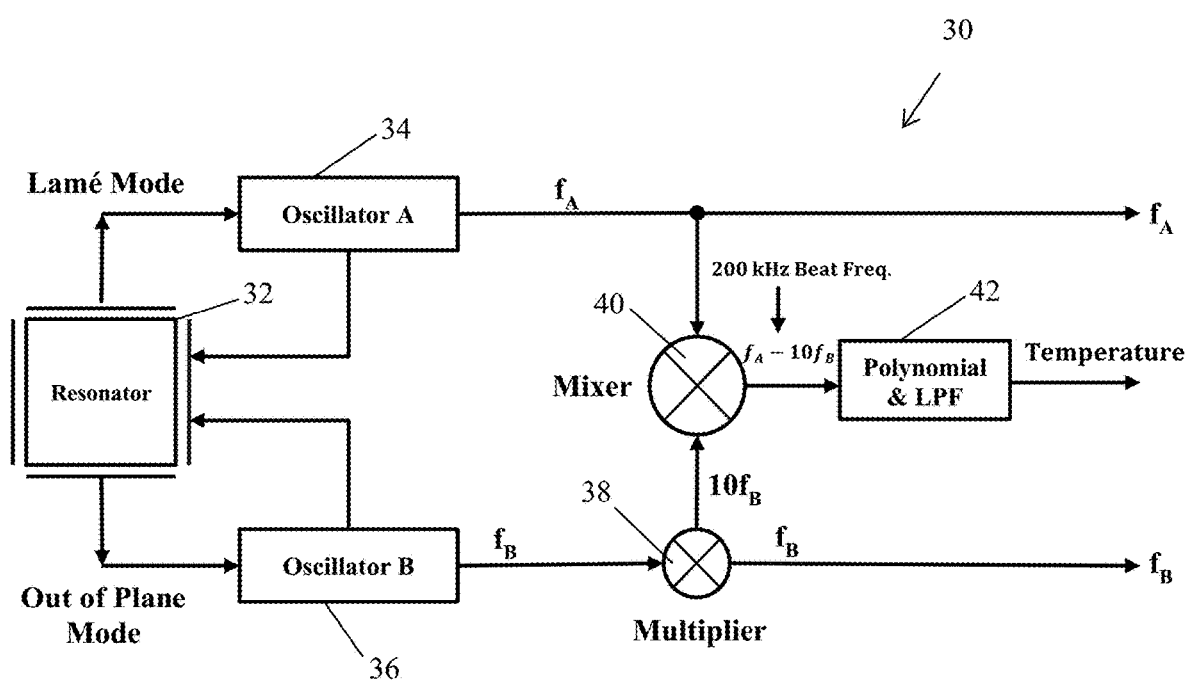
FIG. 4 illustrates a self-sensing dual-mode resonator device adapted to determined its temperature, in accordance with an embodiment.

FIG. 4 illustrates one embodiment of a system 30 for determining the temperature of a MEMS resonator 32.

In one embodiment, the method 10 is executed within the system 30.

The system 30 comprises a first oscillation circuit or oscillator 34 electrically connected to the MEMS resonator 32, and a second oscillation circuit or oscillator 36 also electrically connected to the MEMS resonator 32. It should be noted that the system 30 also comprises power supply components to provide alternating current (AC) and/or DC (direct current) electrical signals for causing the MEMS resonator 32 in the in-plane mode of vibration and the out-of-plane mode of vibration.

The first oscillator 34 is configured for operating the MEMS resonator 32 in an in-plane mode of vibration such as the Lame mode of vibration or the face-shear mode of vibration, in order to obtain a first electrical signal having a first frequency $f_A$. In one embodiment, the first oscillator 34 comprises a transimpedance amplifier (TIA) connected to an automatic gain control (AGC). The transimpedance amplifier converts the current from the MEMS resonator 32 to an output signal. The automatic gain control regulates oscillation amplitude and reduce mechanical non-linear effects.

The second oscillator 36 is configured for operating the MEMS resonator 32 in an out-of-plane mode of vibration such as the second harmonic mode of vibration or the saddle mode of vibration in order to obtain a second electrical signal having a second frequency $f_B$. Similarly, to the first oscillator 34, in one embodiment, the second oscillator 36 comprises a transimpedance amplifier (TIA) connected to an automatic gain control (AGC). The transimpedance amplifier converts the current from the MEMS resonator 32 to an output signal. The automatic gain control regulates oscillation amplitude and reduce mechanical non-linear effects.

It can be said that the MEMS resonator 32 together with the first oscillator 34 and the second oscillator 36 form a MEMS oscillator (not numbered).

The system 30 also comprises a frequency multiplier 38 or multiplier circuit 38 electrically connected to the second oscillator 36 for receiving the second electrical signal therefrom. Generally speaking, the multiplier circuit 38 is a nonlinear electrical circuit that distorts an input signal thereby generating harmonics or multiples of the input signal, and various implementations and topologies thereof are known in the art. The multiplier circuit 38 receives the second electrical signal having the second frequency $f_B$ and multiplies the second frequency $f_B$ by a given factor to output a third electrical signal.

In the illustrated embodiment, the multiplier 38 is configured for multiplying the frequency $f_B$ by 10. As a result, the multiplier 38 outputs the third electrical signal of which the frequency corresponds to the second frequency $f_B$ multiplied by a given factor, such as 10 times the second frequency $f_B$.

The system 30 further comprises a mixing circuit or unit 40 and a temperature determining circuit or unit 42.

The mixing circuit 40 is electrically connected to the first oscillator 34 for receiving the first electrical signal therefrom, and to the multiplier circuit 38 for receiving the third electrical signal therefrom. Generally speaking, the mixing circuit 40, also known as frequency mixer, is a nonlinear electrical circuit that generates a frequency based on two electrical signals, and various implementations and topologies thereof are known in the art. In the illustrated embodiment, the mixing circuit 40 is configured for generating a fourth electrical signal of which the frequency $f_{beat}$ corresponds to the frequency of the first electrical signal, minus the frequency of the fourth electrical signal, i.e. $f_A$ minus $10 \times f_B$.

In one embodiment, the mixing circuit 40 may be adapted to output an electrical signal of which the frequency $f_{beat}$ corresponds to the first frequency $f_A$ divided by $10 \times f_B$.

The temperature determining circuit 42 is electrically connected to the mixing circuit 40 so as to receive the fourth electrical signal therefrom. Generally speaking, the temperature determining circuit 42 is configured to process the fourth electrical signal outputted by the mixing circuit 40 to output an electrical signal indicative of a temperature of the MEMS resonator 32.

The temperature determining circuit 42 applies a high-order polynomial function and a low-pass filter (LPF) to the received fourth electrical signal.

The high-order polynomial function is configured for extracting the temperature of the MEMS resonator 32 from $f_{beat}$, and the LPF is configured for filtering the signal coming from the high-order polynomial function as a non-limiting example by blocking all frequencies greater than $f_{beat}$. Coefficients of the high-order polynomial function may be determined during temperature calibration of the MEMS resonator 32, where MEMS resonator 32 is characterized at different temperatures.

In one embodiment, the order of the polynomial function applied by the temperature determining circuit 42 is determined by the application at hand and the non-linearity factors of the two modes of vibration. In one embodiment, the high-order polynomial function is a second-order polynomial function. In another embodiment, the higher is the non-linearity of $f_{beat}$, the higher is the order of the polynomial function As a non-limiting example, a high-end telecommunications application might require a higher-order polynomial (5th order or above) if the non-linearity of the modes is high. Conversely, for low-end applications the order of the polynomial and thus its complexity can be reduced. The coefficients of the polynomial can be set during the calibration of the devices.

In another embodiment, the polynomial is a 5th order digital polynomial.

The output of the temperature determining circuit 42 is an output electrical signal that is indicative of the temperature of the MEMS resonator 32. For example, the frequency of the signal outputted by the temperature determining circuit 42 is indicative of the temperature of the MEMS resonator 42.

As described above, it should be understood that the two modes of vibration in which the MEMS resonator 32 is operated are designed to have different temperature coefficients of frequency $TCF_A$ and $TCF_B$. Specifically, $f_{beat}$ is dominated by the difference of the first order temperature coefficients $TCF_{A1}$ and $TCF_{B1}$. The second order temperature coefficients $TCF_{A2}$ and $TCF_{B2}$ are designed so as to be cancelled out during processing. As a result, the frequency $f_{beat}$ is a linear function of temperature that can be used as a thermometer.

In one embodiment, the system 30 allows for providing the oscillation electrical signals $f_A$ and $f_B$ concurrently but also reports its temperature $f_{beat}$ in substantially real time. The reported temperature signal is sourced from the MEMS resonator 32 itself, thus there is effectively no parasitic thermal capacitance that may cause hysteresis. In one embodiment, the self-temperature determination architecture of the system 30 eliminates the need to control the temperature of the MEMS resonator package in high-end applications and therefore makes the use of external thermometry obsolete and effectively eliminates temperature related deviations. In comparison to a prior art system that includes an external thermometer or a dual-resonator, the self-temperature sensing architecture of the system 30 introduces a new level of integration and temperature stability. In one embodiment, the quality factor (Q) of the Lame mode and the out-of-plane mode of vibration is 3.2 million and 700 thousand, respectively. Under such conditions, the temperature resolution that can be achieved is approximately 10 μK. In one embodiment, the in-plane and out-of-plane modes of vibration are sufficiently far apart so that there no modal interference that can affect phase noise performance.

Figure 5:
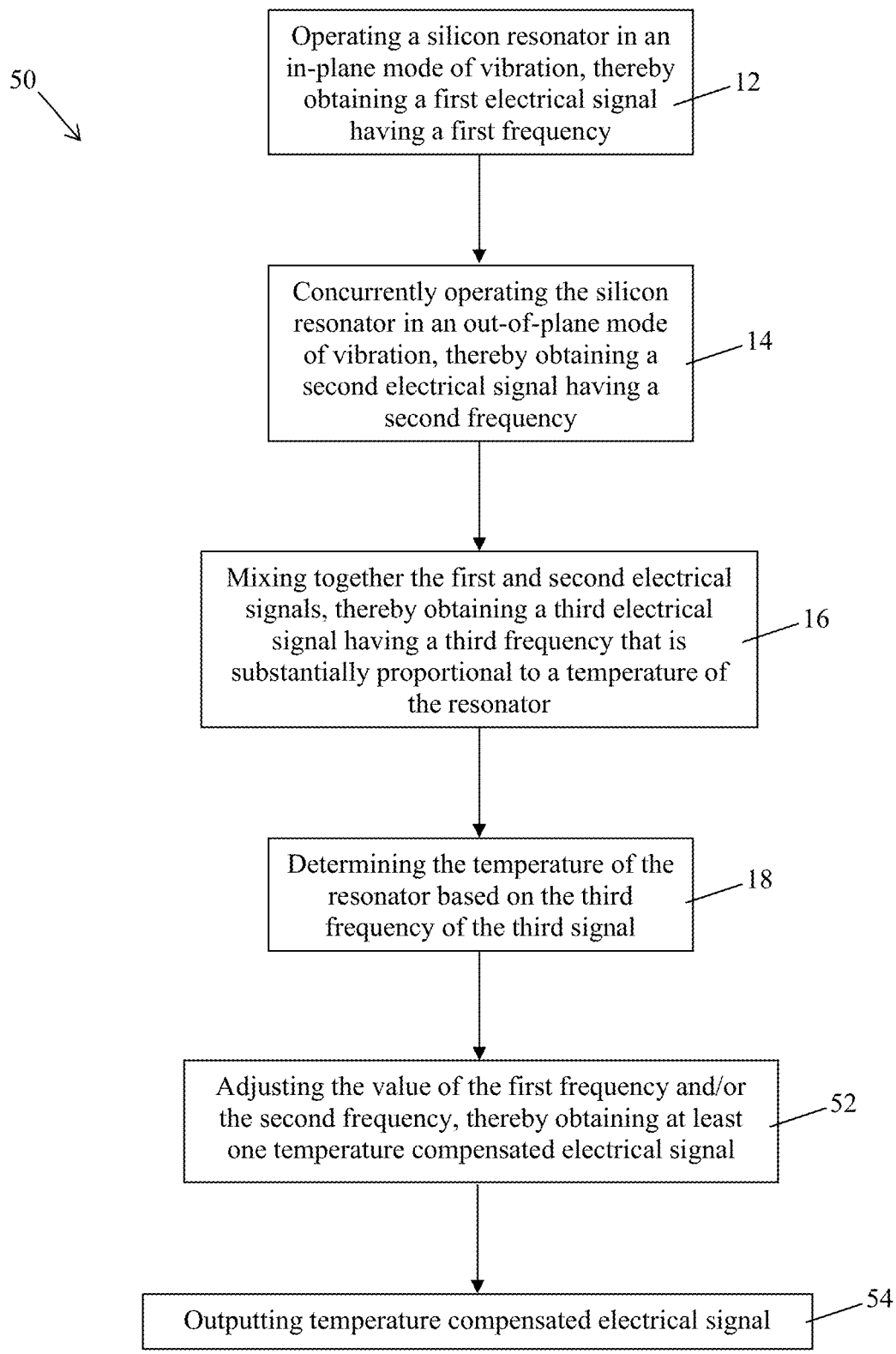
FIG. 5 is a flow chart of a method for generating a temperature compensated frequency signal, in accordance with an embodiment.

FIG. 5 illustrates one embodiment of a method 50 for generating a temperature compensated frequency signal using a MEMS resonator. The first four steps of the method 50 corresponds to the steps 12-18 of the method 10. The output of the step 18 is an electrical signal indicative of the temperature of the MEMS resonator.

Then at step 52, the value of the frequency $f_A$ of the first electrical signal and/or the value of the second frequency fs of the second electrical signal is adjusted using the determined temperature in order to compensate for any frequency variation due to a temperature change for the MEMS resonator. The output of the step 52 is at least one electrical signal each having a compensated frequency.

The temperature compensated frequency signal(s) generated at step 52 is(are) then outputted at step 54.

In one embodiment, the temperature compensation of step 52 is performed by applying an inverse temperature correction function to the frequency signals $f_A$ and $f_B$. In one embodiment, the continuous compensation for temperature variations can be achieved by applying a delta-sigma (ΔΣ) modulation, a multi-modulus division and a fractional-N phase-locked loop (PLL) to the first electrical signal $f_A$ and/or the second electrical signal $f_B$. The electrical signal indicative of the temperature of the MEMS resonator outputted at step 18 is used to set the ΔΣ modulation. The output of the ΔΣ modulation is used for controlling the multi-modulus division. The fractional-N PLL is used to filter quantification noise. It should be understood that the fractional-N PLL may be optional.

In one embodiment, the ΔΣ modulation allows for an analog to digital conversion. In one embodiment, the ΔΣ modulation oversamples the analog signal at its input and then passes it through a decimation filter. The output of the ΔΣ modulation is a high-resolution digital signal (number) that represents the corrective temperature factor.

In one embodiment, the multi-modulus division is an integral part of a Fractional-N PLL block and is located in the feedback loop of the PLL. In one embodiment the signal in the loop is divided by either N or N+1, and the number of times the signal in the loop is divided by N or N+1 is set by the output of the ΔΣ modulation.

In one embodiment, the multi-modulus division may be seen as performing tuning. The division of the reference resonator signal depends on the number that is supplied by the ΔΣ modulation. In one embodiment, if the temperature rises in which case the reference signal would drift lower in frequency, a lower divider is then used in order to keep the output substantially constant.

In an embodiment in which the fractional-N PLL is comprised, the PLL introduces a negative feedback loop that substantially locks-in the phase of the input signal. In one embodiment the PLL is based on an oscillator, a divider (N/N+1 in this case), a loop filter and a phase frequency detector. The goal of the PLL is to lock-in the phase and allow the frequency division of the reference signal so that the output has a substantially constant frequency and a substantially constant phase.

Figure 6:
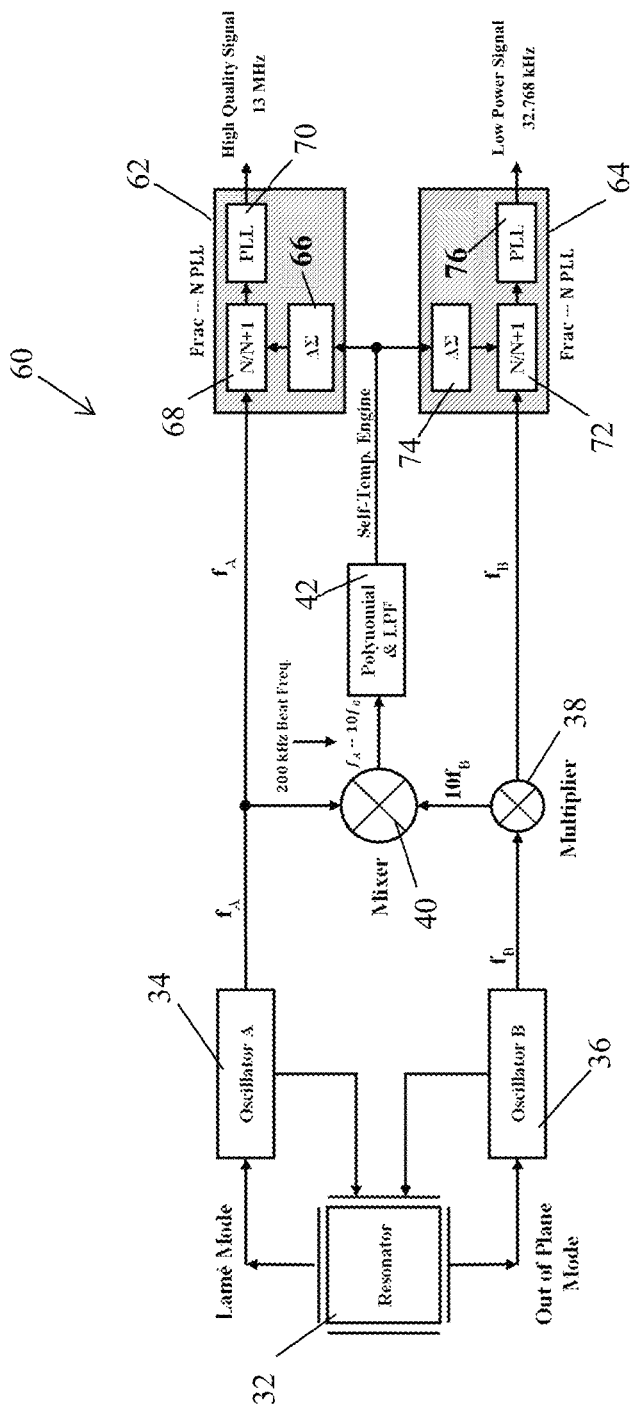
FIG. 6 illustrates an enhanced self-temperature sensing dual-mode resonator device, in accordance with an embodiment.

FIG. 6 illustrates one embodiment of a system 60 for generating a temperature compensated frequency signal using a MEMS resonator 32.

The system 60 comprises the first and second oscillator 34 and 36, the multiplier circuit 38, the mixing circuit 40 and the temperature determining circuit 42 of the system 30.

The system 60 further comprises a first compensation unit 62 and a second compensation unit 64. The first and second compensation units 62 are both electrically connected to the temperature determining circuit 42 for receiving therefrom the electrical signal indicative of the temperature of the MEMS resonator 32.

The first and second compensation units 62 and 64 are further respectively connected respectively to the first oscillator 34 for receiving therefrom the first electrical signal having the frequency $f_A$, and to the multiplying circuit 38 for receiving therefrom the second electrical signal having the frequency $f_B$.

Generally speaking, the purpose of each of the first and the second compensation units 62 and 64 is to process respectively the first electrical signal having the frequency $f_A$ and the second electrical signal having the frequency $f_B$ based on the electrical signal indicative of the temperature of the MEMS resonator 32, to generate a respective electrical signal with temperature compensated frequencies $f_A$ and $f_B$.

In the illustrated embodiment, the first compensation unit 62 is a delta-sigma fractional-N phase locked loop, the first compensation unit 62 comprising: a ΔΣ modulator 66, a multi-modulus divider 68 and a phase-locked loop (PLL) 70.

The ΔΣ modulator 66 encodes analog signals into digital signals. The ΔΣ modulator 66 receives the electrical signal indicative of the temperature of the MEMS resonator 32 outputted at step 18, and processes the electrical signal to output the ΔΣ modulation. It should be noted that the fractional values of the ΔΣ modulator 66 may be determined by obtaining calibration data characterising temperatures of the MEMS resonator 32. The output of the ΔΣ modulation is a high-resolution digital signal (number) that represents the corrective temperature factor.

The multi-modulus divider 68 receives the ΔΣ modulation from the ΔΣ modulator 72, and the first electrical signal having the first frequency from the first oscillator 34, and performs a multi-modulus division, to output a signal received by the PLL 70. In one embodiment the signal in the loop is divided by either N or N+1, and the number of times the signal in the loop is divided by N or N+1 is set by the output of the ΔΣ modulation.

In one embodiment, the multi-modulus divider 68 may be seen as performing tuning. The division of the reference resonator signal depends on the number that is supplied by the ΔΣ modulation. In one embodiment, if the temperature rises in which case the reference signal would drift lower in frequency, the multi-modulus divider 68 uses a lower divider in order to keep the output substantially constant.

The PLL 70 controls received signals and filters quantification noise to generate an electrical signal having a temperature compensated frequency $f_A$. The PLL 70 locks-in the phase and allow the frequency division of the reference signal so that the output has a substantially constant frequency and a substantially constant phase.

The first compensation unit 62 outputs an electrical signal having a temperature compensated frequency $f_A$ and the second compensation unit 64 outputs an electrical signal having a temperature compensated frequency $f_B$.

Similarly, in the illustrated embodiment, the second compensation unit 64 is a delta-sigma fractional-N phase locked loop comprising a ΔΣ modulator 72, a multi-modulus divider 74 and a PLL 76.

The second compensation units 64 comprising the ΔΣ modulator 72, the multi-modulus divider 74 and the PLL 76 processes the electrical signal indicative of the temperature of the MEMS resonator 32 outputted at step 18 and the second electrical signal having the frequency $f_B$ in a manner similar to the first compensation unit 62 to output an electrical signal having a temperature compensated frequency $f_B$.

It should be noted that different configurations and topologies of the first and the second compensation units 62 are possible and should be apparent to persons skilled in the art.

The electrical signal with temperature compensated frequency $f_A$ and the electrical signal with temperature compensated frequency $f_B$ may be received by an external circuit (not depicted in FIG. 6) or a module electrically connected to the system 60 for further processing thereof.

In one embodiment, the elimination of hysteresis enables the knowledge of the exact conditions on the MEMS resonator structure at a given point in time. In one embodiment, the calibration can be performed against $f_{beat}$ instead of against temperature. Since the frequency can be measured to a much higher precision than temperature, thus the calibration curve is bound to be more accurate. In one embodiment, the combination of the two previous points enables a form of ultra-fast temperature calibration, one can simply rapidly sweep the temperature over a specific range and record $f_A$, $f_B$ and $f_{beat}$. There is no need to wait for the temperature of the chamber to stabilize in order to record a calibration point. This is very significant as it not only reduces the time and thus cost of calibration, but it also enables a much higher-level accuracy in the calibration itself compared to traditional approaches.

In one embodiment, the power consumption of the self-temperature sensing architecture of the system 30, 60 can be further improved by introducing a wake-up receiver, which will be described in more detail herein below. In one embodiment, a Lamé mode of vibration resonates at 13 MHz, while the out-of-plane mode of vibration resonates at 1.3 MHz. These two modes power the first oscillator 34 and the second oscillator 36, respectively. Maintaining an oscillation at 1.3 MHz consumes less power than at 13 MHz. The 1.3 MHz signal could be divided down and used for low-power applications, such as 32.768 kHz, while the 13 MHz high-spectral purity signal could be used in high-end applications. Concurrently, the oscillator configuration would supply the application at hand with an accurate temperature signal.

In one embodiment, the system 60 can further comprise an optional charge pump to supply the MEMS resonator 32 bias voltage, As a non-limiting example, the charge pump may bring an input 2.4 W to an output 30-40 W for applications where large voltages are needed.

Figure 7:
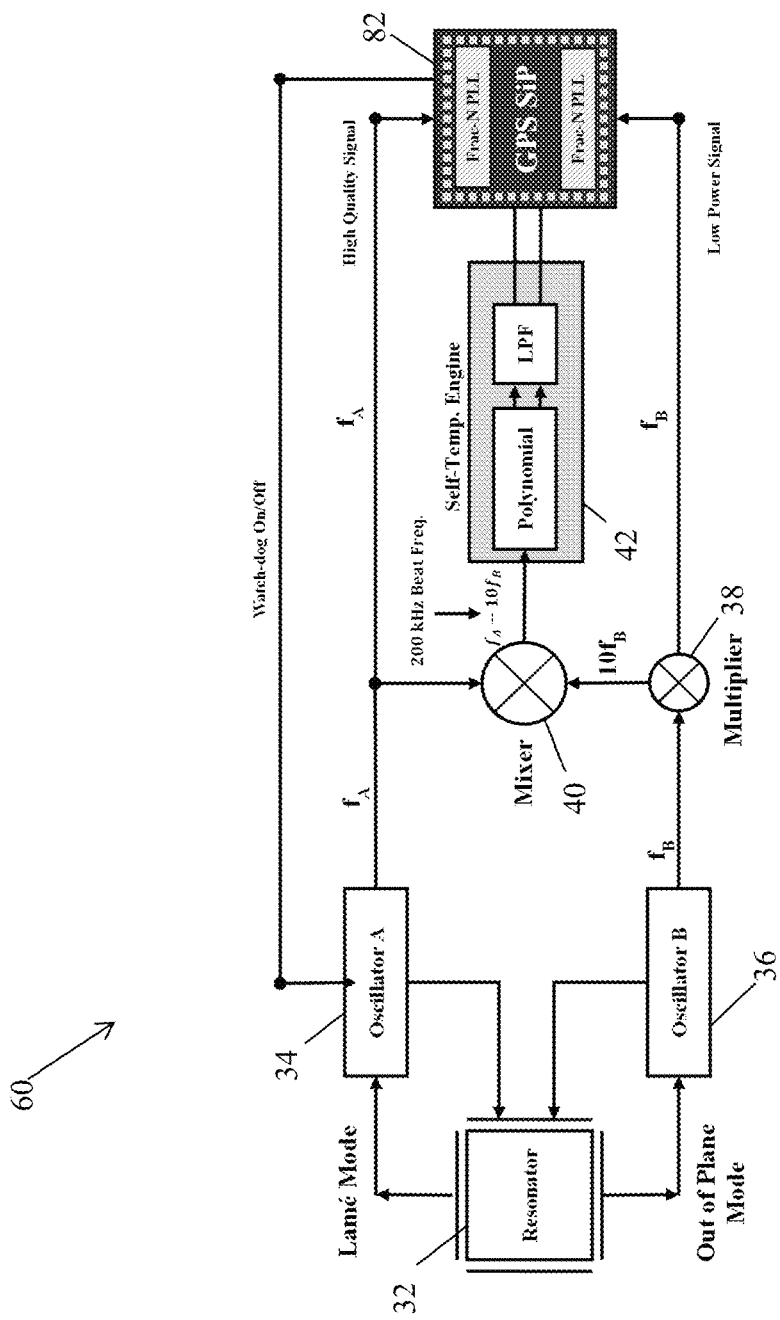
FIG. 7 illustrates a self-temperature sensing resonator device integrated with a wake-up receiver and a high-end GPS receiver, in accordance with an embodiment.

In one embodiment, this architecture could be used on a high-end GPS receiver in order to achieve lower power consumption, as illustrated in FIG. 7. FIG. 7 illustrates one embodiment of a system 80 comprising the first and second oscillator 34 and 36, the multiplier circuit 38, the mixing circuit 40 and the temperature determining circuit 42 of the system 30. The system 80 further comprises a wake-up receiver 82 which includes the first and second compensation circuits 62 and 64 and a control unit or circuit for controlling an activation of the first oscillator 34. The second electrical signal having a frequency at 32.768 kHz for example could be used to maintain the GPS receiver in a low-power standby mode. Upon a geo-location request, or at specific time intervals, the wake-up receiver activates the first oscillator 34. The high-spectral purity signal from the first oscillator 34 A is directly passed on to the GPS receiver. Furthermore, the signals from the first and second oscillators 32 and 36 are mixed and passed through the LPF and high-order polynomial which supplies the GPS receiver with an accurate temperature signal. Upon receipt of this information, the Frac-N PLL of the GPS receiver is able to virtually instantly locate the signal and lock into it. The first oscillator 34 can then be shut down until the next geo-location request. This configuration enables substantial power savings compared to current legacy solutions.

In the following, there is described a MEMS resonator structure capable of passive temperature compensation and a method for fabricating the same.

FIG. 8 illustrates one embodiment of a resonator body 100 which comprises a layer of single crystal silicon (SCS) 102 and a layer of mismatch material 104 deposited on top of the layer of single crystal silicon. The single crystal silicon is doped with a dopant having a concentration chosen so as to minimize a second order temperature coefficient of frequency (TCF) for the MEMS resonator body 100. The mismatch material presents a mismatch in temperature coefficient of elasticity (TCE) with the single crystal silicon and a thickness of layer of mismatch material is chosen so as to minimize the first order TCF for the MEMS resonator body 100.

While the present description refers to a resonator body 100 comprising a layer of SCS, it should be understood that the MEMS resonator 100 may comprise a layer of adequate material other SCS. For example, the MEMS resonator may comprise a layer of Silicon Carbide (SiC), Polycrystalline Silicon (Poly-Si), Quartz, Graphene, Polycrystalline Diamond, or the like.

The MEMS resonator body 100 is anchored to a substrate (not shown) via four anchoring bodies 106. Each anchoring body 106 has a first end secured to the MEMS resonator body 100 and a second and opposite end secured to the substrate.

In the illustrated embodiment, the MEMS resonator body 100 has a rectangular or square shape and each anchoring body 106 is secured on the MEMS resonator body 100 at a tethering point located at a vibration nodal point of the MEMS resonator body 100. It should be understood that other embodiments may be possible. For example, the MEMS resonator body 100 may be anchored to the substrate via a single anchoring body 106 secured on the MEMS resonator body 100 at a tethering point located at a central vibration nodal point of the MEMS resonator body 100.

It should be understood that the MEMS resonator body 100 is spaced apart from the substrate so that a gap exists between the substrate and the MEMS resonator body 100 once anchored thereto.

The present approach relies on two concepts: material property mismatch and ultra-high doping (UHD) of the SCS layer. These techniques rely on the fact that the TCF of silicon MEMS resonators is negative because of negative TCE of silicon. Certain materials, such as $SiO_2$, have a positive first order TCE. Therefore, by carefully designing a composite resonator made of SCS and $SiO_2$, a near zero first-order TCF can be achieved. The material to be deposited needs to have a strong material mismatch compared to the basis material which is SCS. In fact, by adjusting the SCS to $SiO_2$ ratio, one could alter the ToT of the MEMS resonator body 100. Second, doping alters the TCE of SCS. Additionally, compared to the $SiO_2$ composite resonators, doping affects both the first order and second order coefficients and it is possible to zero the second order TCF. The present technique in which both UHD and material mismatch are used is referred to as UHD+ hereinafter.

Figure 8A:
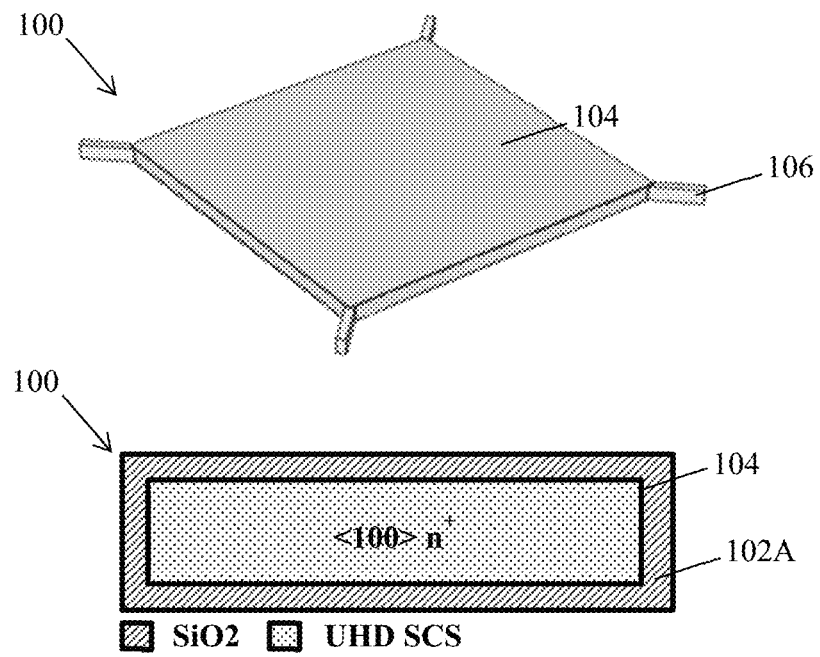
FIGS. 8A, 8B, and 8C illustrate a composite resonator consisting of ultra-highly doped single crystal silicon and a thin layer of $SiO_2$ in accordance with an embodiment.

In the embodiment illustrated in FIG. 8A, the mismatch material 104 deposited on the SCS layer 102 comprises $SiO_2$ and the SCS layer 102A is ultra-high doped with an n-type dopant while the MEMS resonator body is placed in the <100> orientation.

Figure 8B:
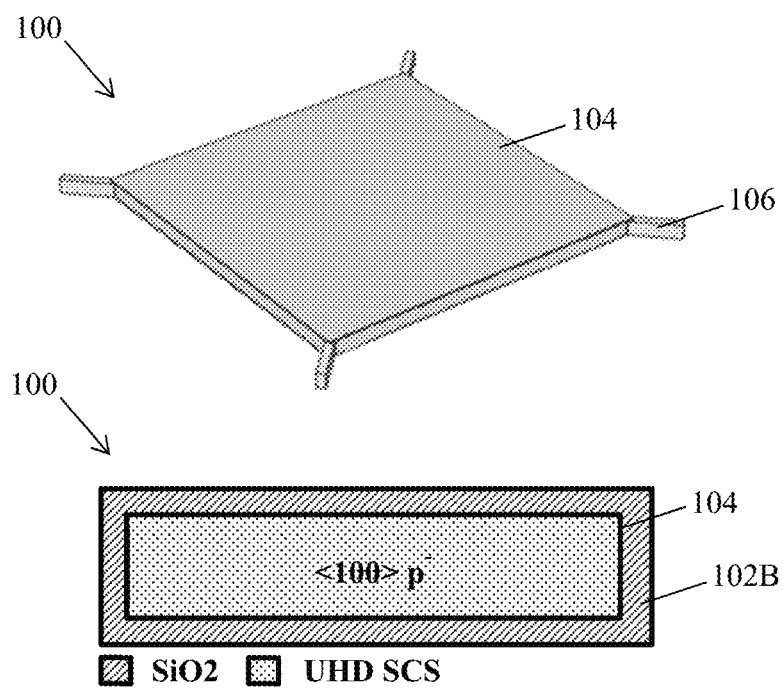

In the embodiment illustrated in FIG. 8B, the mismatch material 104 deposited on the SCS layer 102 comprises $SiO_2$ and the SCS layer 102B is ultra-high doped with an p-type dopant while the MEMS resonator body is placed in the <100> orientation.

Figure 8C:
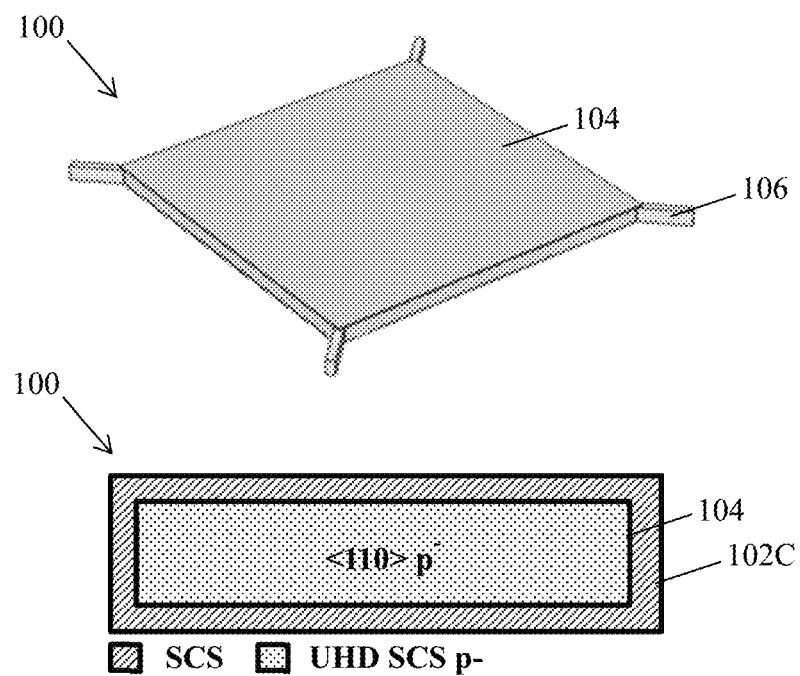

In the embodiment illustrated in FIG. 8C, the mismatch material 104 deposited on the SCS layer 102 comprises $SiO_2$ and the SCS layer 102C is ultra-high doped with an p-type dopant while the MEMS resonator body is placed in the <110> orientation.

Ultra-high doping (UHD) of the SCS layer 102 can be can be used to zero the second order TCF ($TCF_2$) of the MEMS resonator body 100, while the materials mismatch ratio can be used to zero the first order TCF ($TCF_1$) of the MEMS resonator body 100. The technique involves two optimization steps. In the first step, the dopant concentration of the SCS is chosen so that the $TCF_2$ of the MEMS resonator body 100 is zeroed. In the second step, the thickness of $SiO_2$ material to be deposited on top is evaluated.

In one embodiment, both types of doping, p-type doping and n-type doping, may be used. In one embodiment, the concentration of dopant may be between $10^{18}$ and $10^{21}$.

Figure 9A:
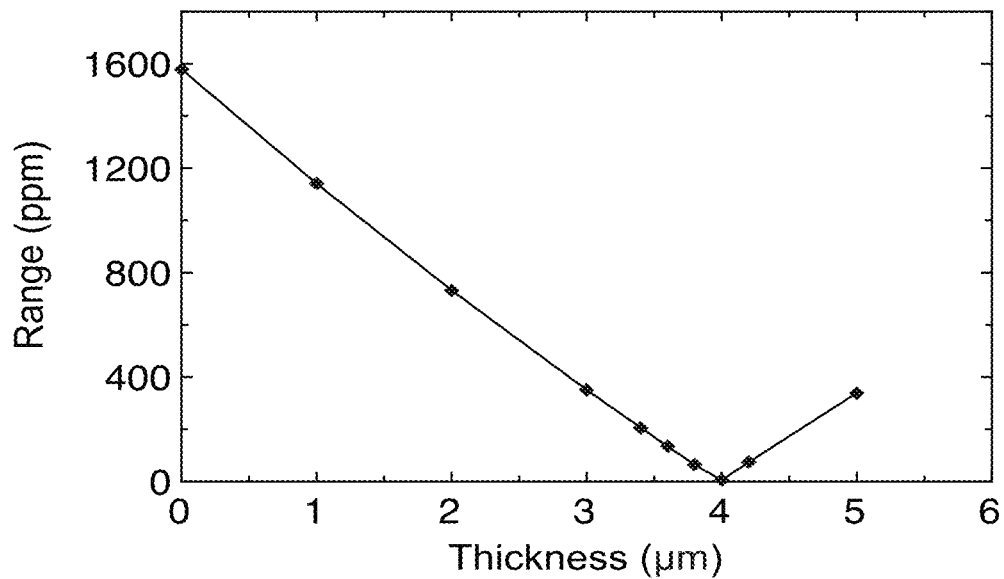
FIGS. 9A and 9B illustrate FEM optimization study on finding the optimal thickness of $SiO_2$ that compensates the first order TCF, in accordance with an embodiment.
Figure 9B:
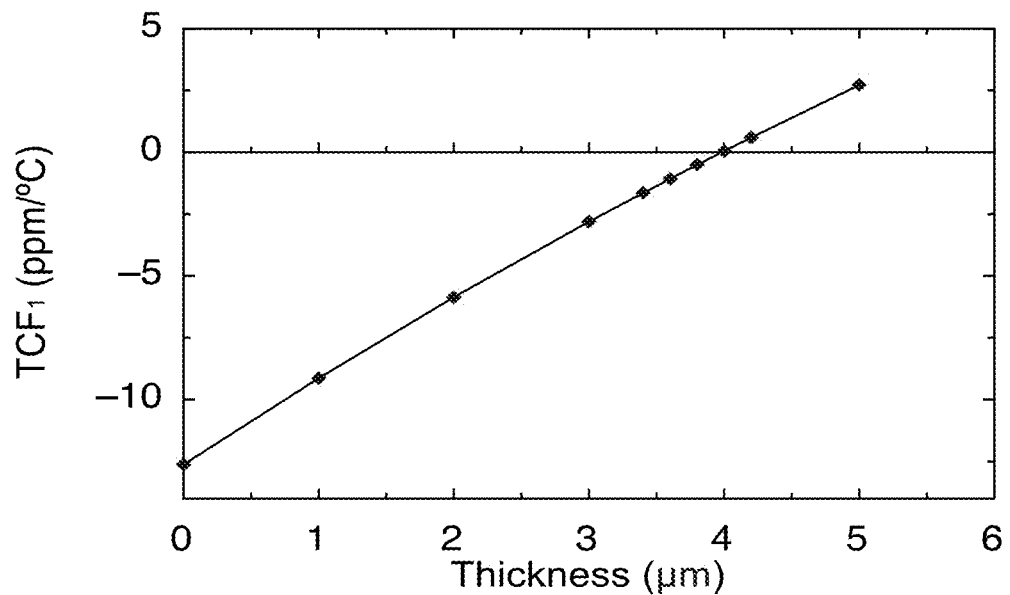

In one embodiment, a thin layer of $SiO_2$ is deposited on top of a UHD SCS layer. The $SiO_2$ layer can be bonded, deposited using Plasma-Enhanced Chemical Vapor Deposition (PECVD), Low-Pressure Chemical Vapor Deposition (LPCVD), thermally grown or any adequate microfabrication process. First, a concentration of 2.3e20 of p-dopant can be used to set the $TCF_2$ of the MEMS resonator to just −0.13 ppb/C2. Second, the optimal thickness of $SiO_2$ needs to be found. Finite Element Modelling (FEM) can be used for calculating the optimal thickness. In one embodiment, the thickness of the UHD SCS is about 17 μm. An optimization study which focuses on finding the ideal $SiO_2$ thickness that compensates TCF1 can now be run. The results, illustrated in FIGS. 9A and 9B, show that a "zero" TCF1 of just 0.04 ppm/C can be achieved using an $SiO_2$ thickness of about 4

μm. The resulting composite UHD resonator body is essentially temperature insensitive, with a total frequency deviation of just 5.5 ppm over the temperature range of −40° C. to +85° C.

Figure 10A:
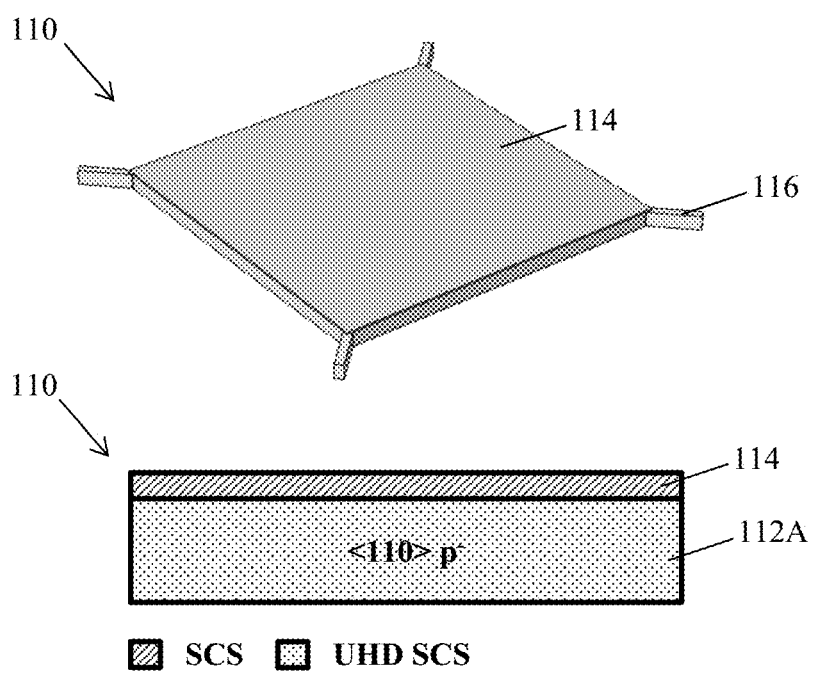
FIGS. 10A, 10B, and 10C illustrate a composite resonator consisting of ultra-highly doped single crystal silicon and a thin layer of non-doped single crystal silicon, in accordance with an embodiment.

FIG. 10A illustrates another embodiment of a resonator body 110 comprising a layer of ultra-high doped SCS 112A on which a layer of non-doped SCS 114 is deposited. The MEMS resonator body 110 is anchored to a substrate (not shown) via four anchoring bodies 116. In this embodiment in which the layer of SCS is p-type doped, the MEMS resonator body 110 was placed in the <110> orientation.

Figure 10B:
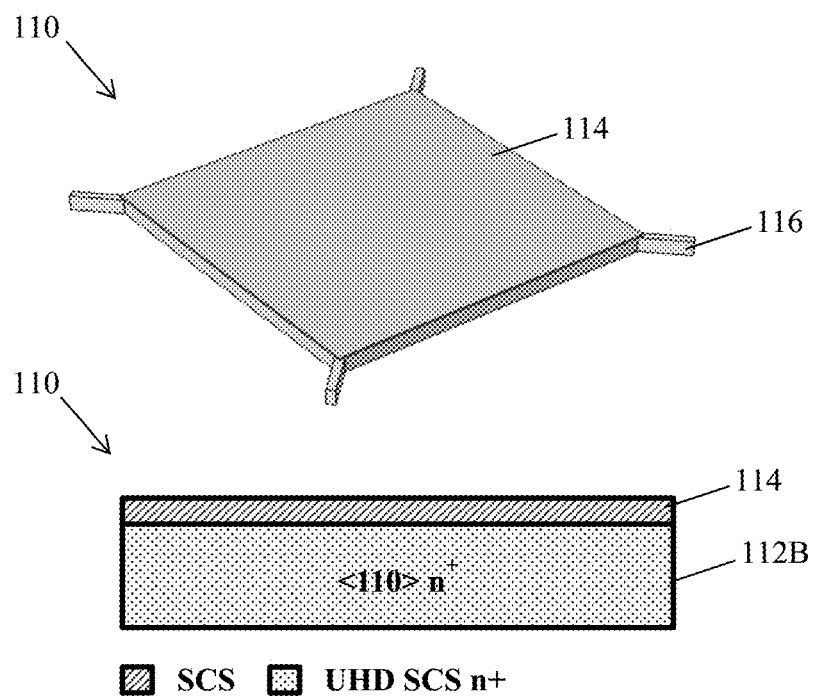

FIG. 10B illustrates another embodiment of a resonator body 110 comprising a layer of ultra-high doped SCS 112B on which a layer of non-doped SCS 114 is deposited. The MEMS resonator body 110 is anchored to a substrate (not shown) via four anchoring bodies 116. In this embodiment in which the layer of SCS is n-type doped, the MEMS resonator body 110 was placed in the <110> orientation.

Figure 10C:
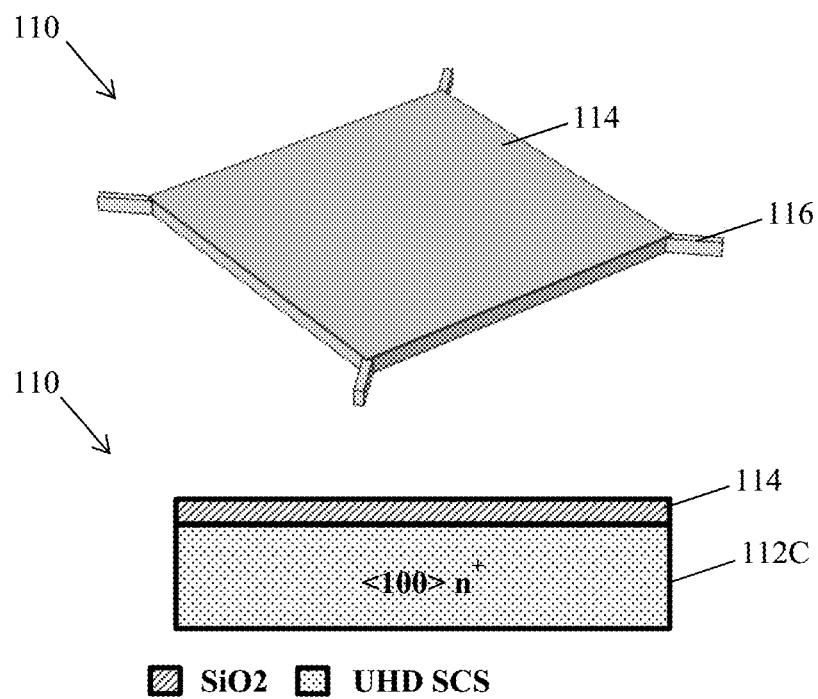

FIG. 10C illustrates another embodiment of a resonator body 110 comprising a layer of ultra-high doped SCS 112B on which a layer of non-doped SCS 114 is deposited. The MEMS resonator body 110 is anchored to a substrate (not shown) via four anchoring bodies 116. In this embodiment in which the layer of SCS is n-type doped, the MEMS resonator body 110 was placed in the <100> orientation.

Figure 11A:
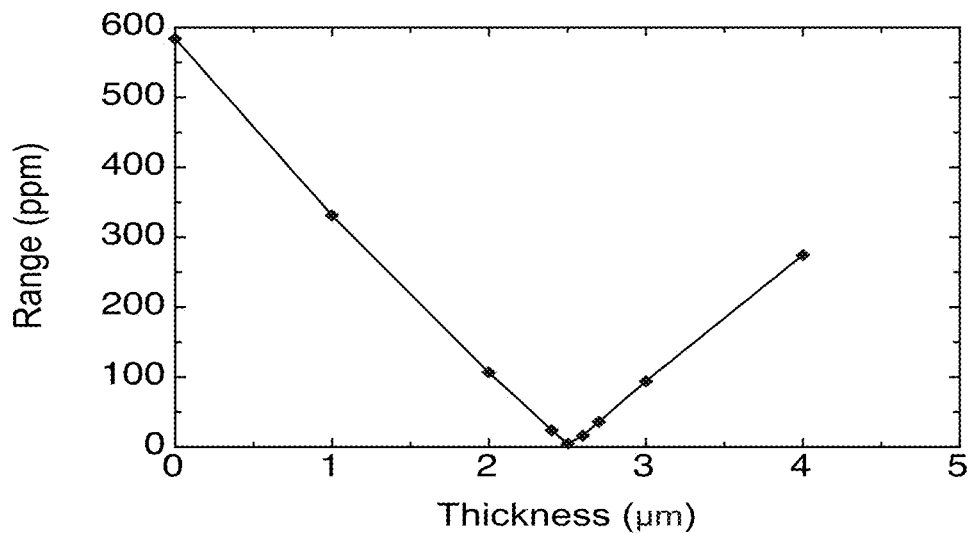
FIGS. 11A and 11B illustrate FEM optimization study on finding the optimal thickness of non-doped single crystal silicon that compensates the first order TCF, in accordance with an embodiment.
Figure 11B:
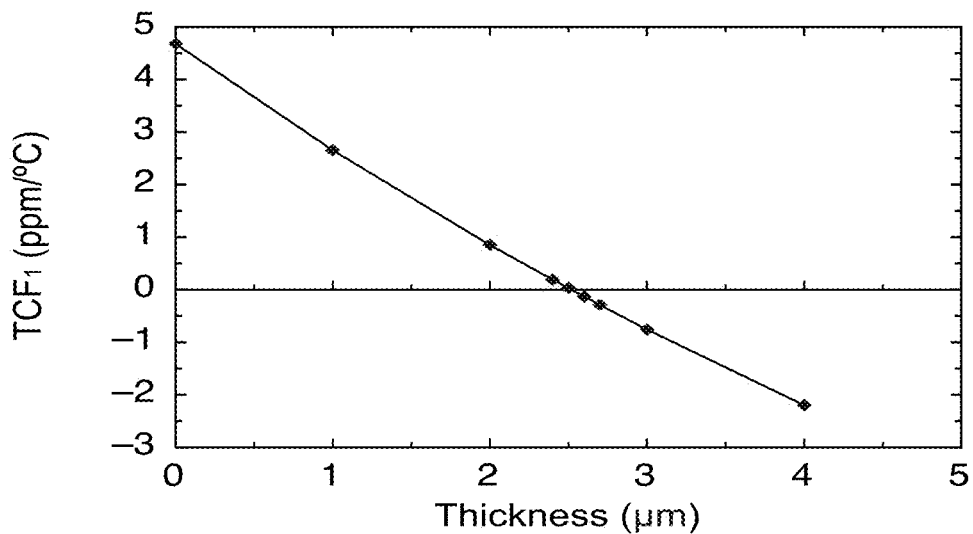

In one embodiment, a thin layer non-doped SCS is deposited on top of a UHD SCS layer. The non-doped SCS can be bonded, deposited, epitaxially grown on the UHD SCS layer. First, a concentration of 2.3e20 of p-type dopant can be used to set the TCF2 of the MEMS resonator body to just −0.58 ppb/C2. Second, the optimal thickness of non-doped SCS needs to be found using FEM for example. In one embodiment, the thickness of the UHD SCS is 17 μm. An optimization study which focuses on finding the ideal non-doped SCS thickness that compensates TCF1 can now be run. The results, illustrated in FIGS. 11A and 11B, show that a "zero" TCF1 of just 0.03 ppm/C can be achieved using a non-doped SCS thickness of just 2.5 μm. The resulting composite UHD resonator is essentially temperature insensitive, with a total frequency deviation of just 4.5 ppm over the temperature range of −40° C. to +85° C.

Figure 12:
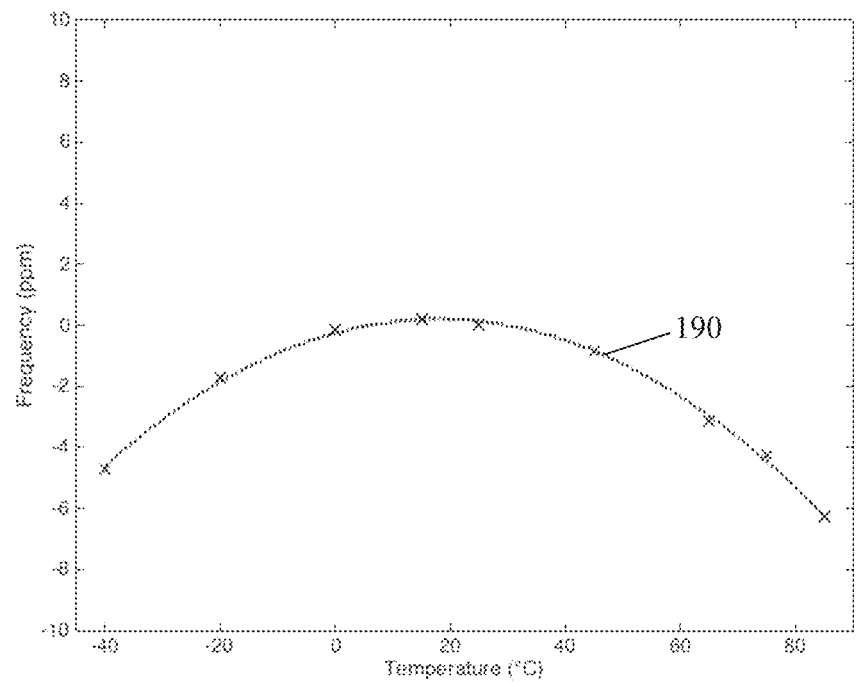
FIG. 12 illustrates an exemplary frequency temperature dependence for a resonator device.

In one embodiment, the UHD+ approach can used with any material having sufficient material mismatch properties with UHD SCS. In comparison with prior art techniques, the UHD+ technique can achieve a temperature stability improvement that is over an order of magnitude better. The resulting frequency temperature dependency curve 190 of a UHD+ resonator, utilizing UHD SCS and non-doped SCS, is illustrated in FIG. 12. A stability of 4.5 ppm can be achieved over the entire temperature range.

Figure 13:
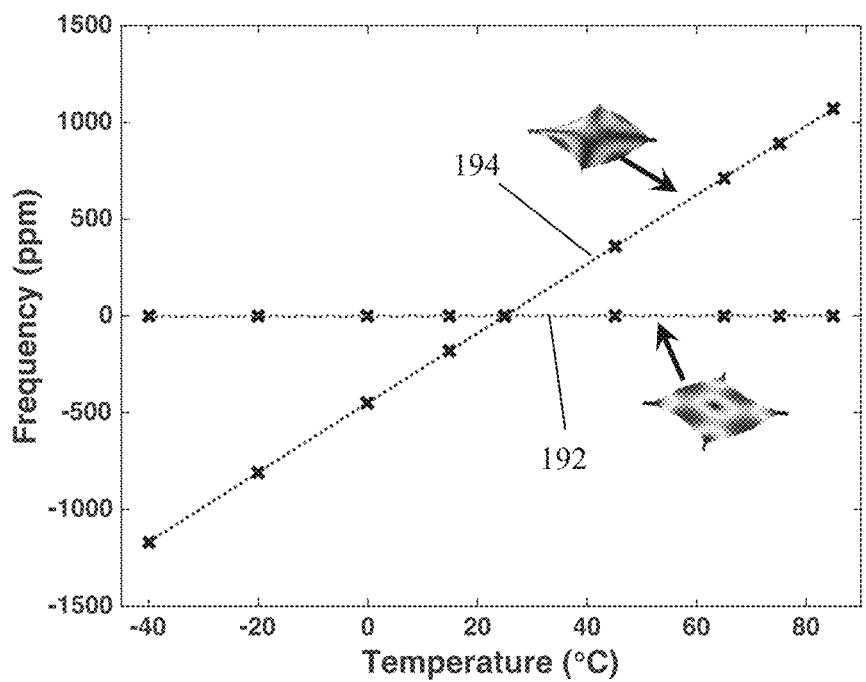
FIG. 13 illustrates a frequency temperature dependence for a Lamé mode of vibration and an out-of-plane mode of vibration of a resonator device.
Figure 14:
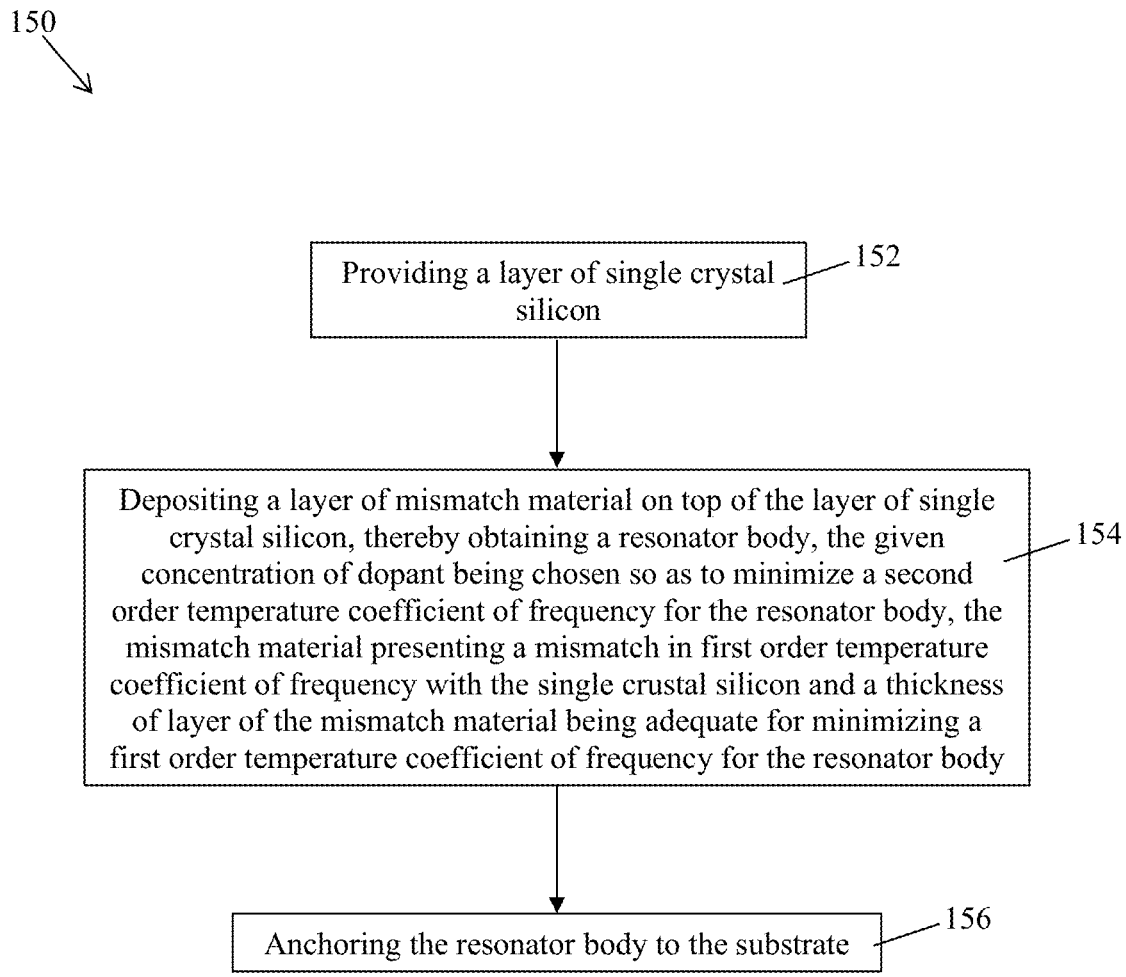
FIG. 14 is a flow chart of a method for fabricating a resonating structure, in accordance with an embodiment.

The UHD+ technique can further be combined with the self-temperature dual-mode sensing technique presented in FIGS. 5 and 6. The in-plane mode frequency temperature function 192 for the Lame mode, and the out-of-plane mode frequency function 194 for the saddle mode is illustrated in FIG. 13. The out-of-plane mode is an almost perfect thermometer with a TCF2 of just −1.5 ppb/C2. Conversely, the Lame mode has both the TCF1 and TCF2 fully compensated. The resulting frequency temperature dependence for the Lame mode is approximately 0.04 ppm/C. Assuming the temperature accuracy of the self-temperature sensing resonator is ±0.01° C., then the resulting total frequency stability over the entire range could be compensated to just ±0.4 ppb. In one embodiment, actively compensated UHD+ based oscillators can yield a frequency stability that is on par with state-of-art delicate Chip-Scale-Atomic Clocks.

In one embodiment, n-type dopants such as phosphorus, arsenic, bismuth, lithium, or the like may be used.

In one embodiment, p-type dopants such as boron, aluminum, gallium, indium or the like may be used.

In one embodiment, the above-described passive and active temperature compensation principles are not limited to MEMS resonators. They can be applied to any other type of MEMS device such as an inertial measurement unit (IMU) system, directly or indirectly. Most MEMS IMUs are currently microfabricated using SCS, thus they suffer from the same temperature challenges as MEMS resonators.

In the direct form, the temperature compensation techniques would be applied to the MEMS device at hand. For example, the resonant frequency of a MEMS gyroscope could be stabilized by fabricating it using the UHD+ process and applying the temperature self-sensing technique at the system level. It should be noted that the UHD+ can be used to provide passive temperature compensation to any MEMS device that has a resonant frequency. FEM simulations could be used to apply it to any MEMS resonant structure. It is reasonable to expect that an UHD+ MEMS gyroscope would have an almost zero TCF, thus leading to an order of magnitude stability over currently available devices.

In the indirect form, the temperature compensation techniques described herein would be applied directly to a MEMS frequency reference. The MEMS frequency reference could then be integrated with a compact IMU in a unified microfabrication process. Such an implementation would offer tremendous stability advantages. As stated before currently available IMUs suffer from drifts that are related to time and temperature. A direct integration with the technologies described herein, in particular an ultra-stable MEMS frequency reference, would address both of these technical challenges concurrently. The ultra-stable MEMS frequency reference would keep an extremely accurate count of time, while also providing an ultra-high-resolution temperature signal. These two inputs could potentially be supplied to a microcontroller unit that compensates for any induced drifts. Such an embodiment would enable navigational grade IMUs with Potentially such an implementation would enable affordable navigation level IMUs with numerous applications in autonomously navigated vehicles and drones. Additionally, due to the minimization of drifts it is possible to envision indoor and outdoor navigation that relies on a simple IMU.

Figure 15:
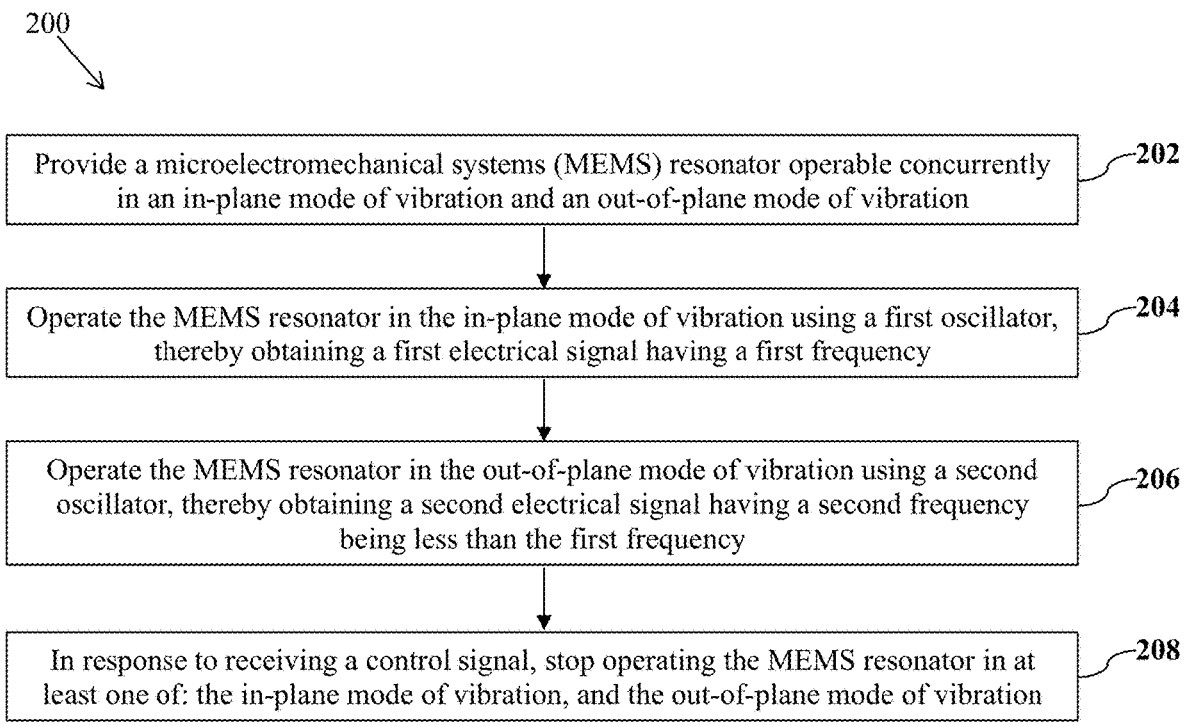
FIG. 15 is a flow chart of a method for selectively operating a MEMS oscillator in accordance with an embodiment.

FIG. 15 illustrates one embodiment of a method 150 for fabricating a resonator structure.

At step 152, a layer of SCS is provided. The layer of SCS is doped with an adequate dopant having a specific concentration, at step 154.

At step 156, a layer of mismatch material presenting a mismatch in temperature coefficient of elasticity (TCE) with the SCS is deposited on top of the layer of SCS. The layer of SCS and the layer of mismatch material form together a resonator body.

As described above, the specific concentration of dopant is chosen so as to minimize or zero the second order temperature coefficient of frequency for the MEMS resonator body. The thickness of layer of mismatch material is chosen so as to minimize or zero the first order temperature coefficient of frequency for the MEMS resonator body.

At step 158, the MEMS resonator body is anchored to a substrate. In one embodiment, the step of anchoring the MEMS resonator body to the substrate may comprise anchoring a tethering point located at the central vibration nodal point of the MEMS resonator body to the substrate. In another embodiment, the step of anchoring the MEMS resonator body to the substrate may comprise anchoring to the substrate four tethering points each located at a respective vibration nodal point of the MEMS resonator body.

In one embodiment, the dopant is a p-type dopant. For example, the p-type dopant may be boron, aluminum, gallium, indium or the like.

In another embodiment, the dopant is a n-type dopant. For example, the n-type dopant may be phosphorus, arsenic, bismuth, lithium or the like.

As described above, the mismatch material may be $SiO_2$. In another embodiment, the mismatch material may be undoped silicon.

It should be understood that any adequate method for securing or depositing the layer of mismatch material on the SCS layer may be used. For example, Plasma-Enhanced Chemical Vapor Deposition (PECVD), a Low-Pressure Chemical Vapor Deposition (LPCVD), a thermal growth or the like may be used.

With reference to FIG. 15, there is depicted a flow chart of a method 200 of selectively controlling frequencies outputted by a dual-output MEMS resonator.

As a non-limiting example, the method 200 may be executed by a microcontroller electrically connected to a circuit comprising inter alia a MEMS resonator, a first oscillator, and a second oscillator.

At step 202, the MEMS resonator is operated in an in-plane mode of vibration using a first oscillation circuit or first oscillator electrically connected to the MEMS resonator. A first electrical signal having a first frequency is then generated by the MEMS resonator.

In one embodiment, the in-plane mode of vibration is the Lamé mode of vibration of the MEMS resonator. In another embodiment, the in-plane mode of vibration is the face-shear mode of vibration of the MEMS resonator.

At step 204, the MEMS resonator is operated in an out-of-plane mode of vibration using a second oscillation circuit or oscillator electrically connected to the MEMS resonator. A second electrical signal having a second frequency different from the first frequency is then generated by the MEMS resonator.

In one embodiment, the out-of-plane mode of vibration is the second harmonic mode of vibration of the MEMS resonator. In another embodiment, the out-of-plane mode of vibration is the saddle mode vibration of the MEMS resonator.

In one embodiment, the first frequency of the first electrical signal is greater than the second frequency of the second electrical signal.

It should be understood that in accordance with embodiments of the MEMS resonator described herein, step 202 and step 204 may be performed concurrently, or sequentially (i.e. step 204 may be performed before step 202, or after step 202).

In embodiments where the steps 202 and 204 are performed concurrently, the MEMS resonator generates the first and second signal concurrently.

At step 206, a first control or command signal is received.

The first control signal can be a signal received from an external circuit connected to at least one of the first oscillator and the second oscillator. In one embodiment, the external circuit may be a microcontroller unit (MCU).

In one embodiment, the first control signal causes the first oscillator to stop operating, which causes the MEMS resonator to stop providing the first electric signal having the first frequency $f_A$.

In one embodiment, the second oscillator can be always active in order to provide the system with a continuous second electric signal, such as for a real-time clock (RTC) application. In another embodiment, the second oscillator can be selectively operated by an external control signal.

In another embodiment, the first control signal causes the second oscillator to stop operating, which causes the MEMS resonator to stop providing the second electrical signal having the second frequency $f_B$.

In a further embodiment, the first control signal may cause both the first oscillator and the second oscillator to stop operating, which causes to MEMS resonator to stop providing the first and second electric signals respectively.

It should be noted that the first frequency $f_A$ and the second frequency $f_B$ may be temperature compensated frequencies, such as the electrical signals having temperature compensated first frequency $f_A$ and the temperature compensated second frequency fs outputted by the method 50.

In one embodiment, the method 200 may end at step 206.

At step 208, a second control or command signal is received.

In one embodiment, where the first control signal caused the first oscillator to stop operating the MEMS resonator to output the first signal having the first frequency, the second control signal causes the first oscillator to operate the MEMS resonator, to obtain an electrical signal having the first frequency. In one embodiment, the second oscillator may be always active to operate the MEMS resonator to obtain the second electric signal continuously.

In another embodiment, where the first control signal caused the second oscillator to stop operating the MEMS resonator to output the second electrical signal having the second frequency, the second control signal causes the second oscillator to operate the MEMS resonator to obtain an electrical signal having the second frequency. In one embodiment, the first oscillator may be always active to operate the MEMS resonator to obtain the first electric signal continuously.

It should be understood that in the embodiment where the first and the second oscillators have stopped operating, the second control signal may cause at least one of the first and second oscillators to operate: the first oscillator, the second oscillator, and both the first oscillator and second oscillators.

In one embodiment, the method 200 allows an external circuit to be constantly active to provide a first frequency or a second frequency by operating a single MEMS resonator while consuming less power than conventional circuits providing two frequencies.

It should be understood that the method 200 may be combined with the method 10, the method 50, and/or executed before, or after the method 10 and/or the method 50.

Figure 16:
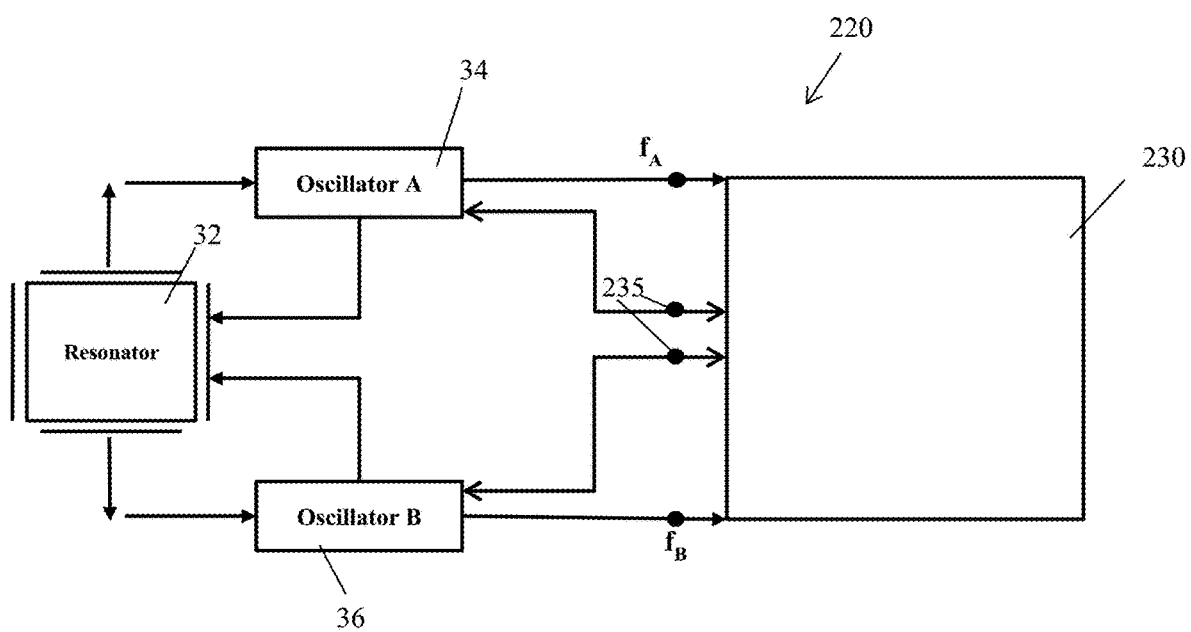
FIG. 16 illustrates a wake-up architecture of the dual-mode resonator device, in accordance with an embodiment.

Now turning to FIG. 16, there is illustrated one embodiment of a system 220 for selectively operating a MEMS oscillator.

The system 220 allows operating selectively the MEMS oscillator comprising inter alia the MEMS resonator 32, the first oscillator 34 and the second oscillator 36 of the system 30 to output at least one of the first electrical signal having the first frequency $f_A$ and the second electrical signal having the second frequency $f_B$.

The system 220 comprises the MEMS resonator 32, the first oscillator 34 and the second oscillator 36 of the system 30, electrically connected to an external circuit 230.

Generally speaking, the external circuit 230 is configured to receive the first and second electrical signal having respectively frequencies $f_A$ and $f_B$ output by the MEMS resonator 32. The external circuit 230 is also configured to selectively operate the first oscillator 34, and the second oscillator 36, via a control signal.

In one embodiment, the external circuit 230 comprises a microcontroller unit (MCU). In another embodiment the external circuit 230 comprises a microprocessor. In an alternative embodiment, the external circuit 230 comprises a Bluetooth® Low Energy (BLE) Module.

In one embodiment, the external circuit 230 allows controlling frequencies output by the system 220 by transmitting control signals thereto. The external circuit 230 may control frequencies outputted by the MEMS resonator 32 by operating the first oscillator 34 and the second oscillator 36 via a PIN 235. In one embodiment, the PIN 235 is an output enable (OE) pin. In another embodiment, the PIN is 235 frequency select (FS) pin.

In one embodiment, the external circuit 230 causes the first oscillator 34 to operate the MEMS resonator 32 in an in-plane mode of vibration in order to obtain a first electrical signal having a first frequency $f_A$ by transmitting a control signal. The in-plane mode of vibration may be the Lame mode, or the face-shear mode. The external circuit 230 thereby receives the first electrical signal having the first frequency $f_A$ outputted by the MEMS resonator 32.

In one embodiment, the external circuit 230 causes the second oscillator 36 to operate the MEMS resonator 32 in an out-of-plane mode of vibration in order to obtain a second electrical signal having a second frequency $f_B$ by transmitting a control signal. The out-of-plane mode of vibration may be the second harmonic mode of vibration, or the saddle mode. The external circuit 230 thereby receives the second electrical signal having the second frequency $f_B$ outputted by the MEMS resonator 32.

It should be noted that the external circuit 230 may transmit one control signal to control the first oscillator 34 and the second oscillator 36 concurrently or may transmit a control signal to control each one of the first oscillator 34 and the second oscillator 36 depending on how the system 220 is configured.

In one embodiment, the external circuit 230 allows operation of the MEMS resonator 32, the first oscillator 34 and/or the second oscillator 36 in a wake-up or stand-by mode, such that the MEMS resonator 32 continuously provides one of the first electrical signal or the second electrical signal while another one of the first and second electrical signals is not generated and provided, thereby saving power resources. As a non-limiting example, the external circuit 230 allows controlling the MEMS resonator 32 such that the MEMS resonator 32 only provides the first electrical signal having the first frequency $f_A$, the first frequency being between 1 to 40 MHZ, such as for real-time clock (RTC) applications.

Thus, it may be said that the MEMS oscillator comprising inter alia the MEMS resonator 32, the first oscillator 34 and/or the second oscillator 36 are configured to be selectively operated upon reception of a control signal from the external circuit 230.

It should be noted that the external circuit 230 may comprise more than one circuit and/or components, where each circuit and/or component could have respective control of at least one of the first oscillator 34 and the second oscillator 36 to operate the MEMS resonator 32.

Figure 17:
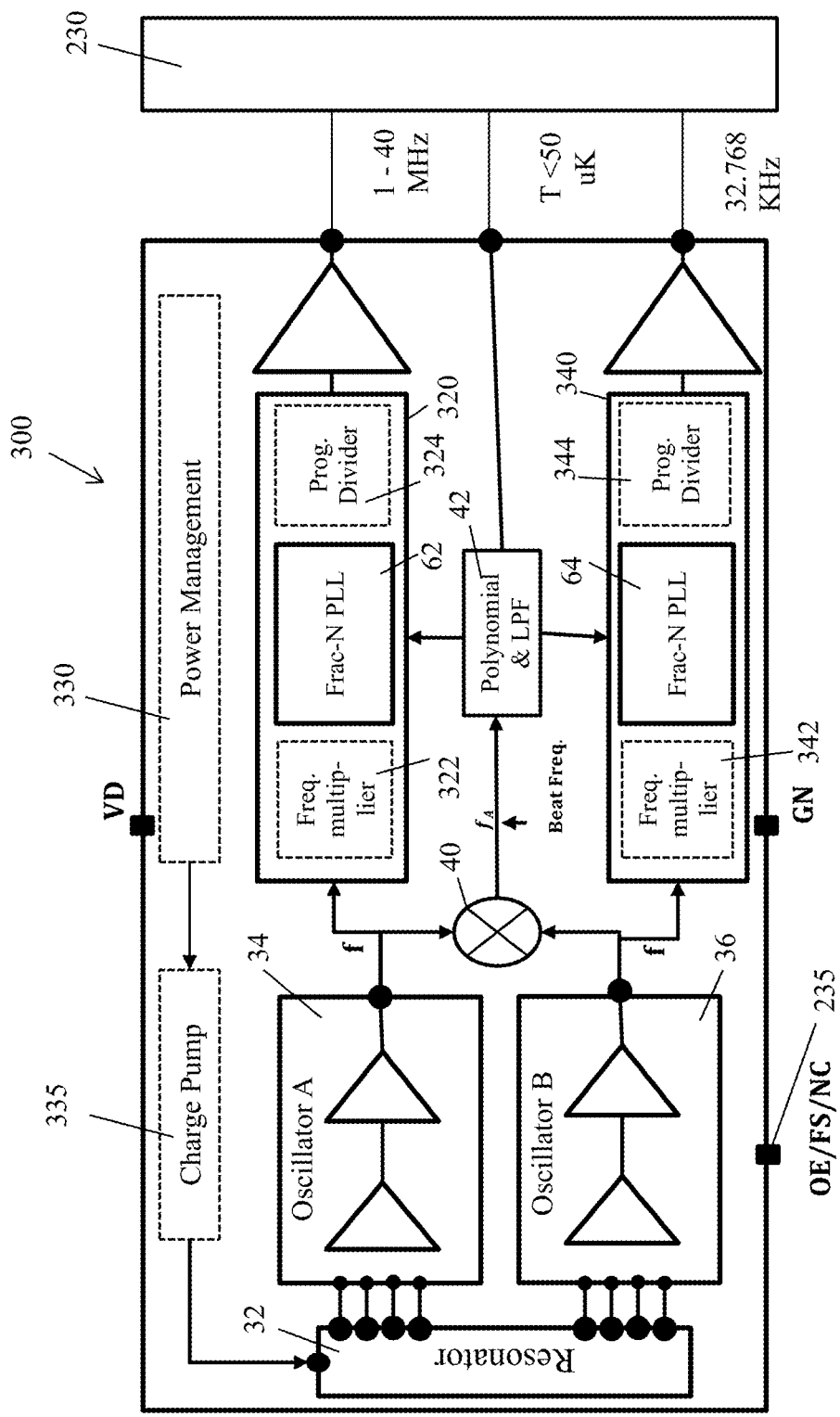
FIG. 17 illustrates a wake-up architecture of an enhanced self-temperature sensing dual-mode resonator device, in accordance with an embodiment.

With reference to FIG. 17, there is depicted a system 300 for selectively operating a temperature compensated dual-output MEMS resonator in accordance with one embodiment.

The system 300 combines components of the system 60 and the system 220.

The system 300 comprises inter alia the MEMS resonator 32, the first oscillator 34, the second oscillator 36, the mixing circuit 40, the temperature determining circuit 42, a first compensation unit 320 and a second compensation unit 340, a charge pump 335, a power management module 330, and a PIN 235, connected to the external circuit 230.

The first oscillator 34 and the second oscillator 36 both comprise a respective TIA (not numbered) connected to a respective AGC (not numbered).

The mixing circuit 40 and the temperature determining circuit 42 are configured in a manner similar to the system 60 and will not be described in more detail herein.

The system 300 comprises the PIN 235. The PIN 235 may be used by the external circuit 230 to control output of at least one of the temperature compensated first frequency $f_A$ and the temperature compensated second frequency $f_B$, as well as the determined temperature outputted by the temperature determining circuit 42

The first compensation unit 320 is electrically connected to the mixing circuit 40 and the first oscillator 34.

The first compensation unit 320 comprises: a frequency multiplier 322, the first compensation unit 62 of the system 60, and a programmable divider 324. It should be noted that the multiplier circuit 322 and the programmable divider 324 are optional depending on the application, and in this case the first compensation unit 320 corresponds to the first compensation unit 62.

The multiplier circuit 322 is similar to the multiplier circuit 38 and is a nonlinear electrical circuit that distorts an input signal thereby generating harmonics or multiples of the input signal. The multiplier circuit 322 In one embodiment, the multiplier circuit 322 is a frequency doubler.

The programmable divider 324 is configured to reduce an inputted frequency in powers of two to 1 Hz.

The first compensation unit 320 outputs a temperature compensated first frequency $f_A$.

The second compensation unit 340 is connected to the mixing circuit 40 and the second oscillator 36. The second compensation unit 340, similarly to the first compensation unit 320 comprises a multiplier circuit 342, the first compensation unit 62 of the system 60, and a programmable divider 344.

The second compensation unit 340 outputs a temperature compensated first frequency $f_B$.

The power management module 330 is electrically connected to an external power source and to the MEMS resonator 32 and is configured to provide a desired voltage to the MEMS resonator 32, the desired voltage, which may be different from the regular output voltage outputted by the MEMS resonator 32 may be required for specific applications. The power management module 330 is optional depending on the application.

The charge pump 335 is electrically connected to the power management module 330 and the MEMS resonator 32 to supply the MEMS resonator 32 with a bias voltage as an integer multiple of the input voltage from the external power source for some applications. It should be noted that the charge pump 335 is optional depending on the application.

In one embodiment, the charge pump 335 is connected to a power management module 330 for managing power.

In one embodiment, the temperature compensated first frequency of the dual-output MEMS oscillator is between 1 MHz to 40 MHz, while the temperature compensated second frequency of the dual-output MEMS oscillator is 32.768 kHz.

The embodiments of the technology described above are intended to be exemplary only. The scope of the technology is therefore intended to be limited solely by the scope of the appended claims.

The invention claimed is:

1. A resonating structure comprising:
a substrate;
a resonator body, wherein the resonator body is doped with a dopant having a concentration chosen so as to minimize a second order temperature coefficient of frequency for the resonator body, and wherein the resonator body is operable in an in-plane mode of vibration and an out-of-plane mode of vibration; and
an anchoring body for anchoring the resonator body to the substrate.

2. The resonating structure of claim 1, wherein the resonator body is (i) electrically connectable to a first oscillator for operating in the in-plane mode of vibration and (ii) electrically connectable to a second oscillator for operating in the out-of-plane mode of vibration.

3. The resonating structure of claim 1, wherein the in-plane mode of vibration comprises a Lamé mode of vibration or a face-shear mode of vibration, and wherein the out-of-plane mode of vibration comprises a second harmonic out-of-plane mode of vibration or a saddle mode of vibration.

4. The resonating structure of claim 1, wherein the resonator body comprises a layer of base material that is doped with the dopant and a layer of mismatch material, and wherein a thickness of the layer of mismatch material is chosen so as to minimize a first order temperature coefficient of frequency for the resonator body.

5. The resonating structure of claim 1, wherein the anchoring body extends from a central vibration nodal point of the resonator body in an out-of-plane direction relative to the resonator body to anchor the resonator body to the substrate.

6. The resonating structure of claim 1, wherein the anchoring body extends from the resonator body in an in-plane direction relative to the resonator body to anchor the resonator body to the substrate.

7. The resonating structure of claim 6, wherein the anchoring body extends from a nodal vibration corner point of the resonator body to anchor the resonator body to the substrate.

8. The resonating structure of claim 1, wherein the anchoring body is a first anchoring body, the resonating structure further comprising three additional anchoring bodies for anchoring the resonator body to the substrate.

9. The resonating structure of claim 1, wherein the dopant comprises a p-type dopant.

10. The resonating structure of claim 9, wherein the p-type dopant comprises boron, aluminum, gallium, or indium.

11. The resonating structure of claim 1, wherein the dopant comprises an n-type dopant.

12. The resonating structure of claim 11, wherein the n-type dopant comprises phosphorus, arsenic, bismuth, or lithium.

13. The resonating structure of claim 1, wherein the concentration of the dopant is between $10^{18}$ cm$^{-3}$ and $10^{21}$ cm$^{-3}$.

14. The resonating structure of claim 1, wherein the dopant comprises a p-type dopant and an n-type dopant.

15. A method for fabricating a resonating structure, the method comprising:
providing a resonator body;
doping the resonator body with a dopant having a given concentration chosen so as to minimize a second order temperature coefficient of frequency for the resonator body, wherein the resonator body is operable in an in-plane mode of vibration and an out-of-plane mode of vibration; and
anchoring the resonator body to a substrate.

16. The method of claim 15, wherein the resonator body is (i) electrically connectable to a first oscillator for operating in the in-plane mode of vibration and (ii) electrically connectable to a second oscillator for operating in the out-of-plane mode of vibration.

17. The method of claim 15, wherein the in-plane mode of vibration comprises a Lame mode of vibration or a face-shear mode of vibration, and wherein the out-of-plane mode of vibration comprises a second harmonic out-of-plane mode of vibration or a saddle mode of vibration.

18. The method of claim 15, wherein the resonator body comprises a layer of base material and a layer of mismatch material, and wherein doping the resonator body with the dopant comprises:
doping the layer of base material with the dopant.

19. The method of claim 15, wherein anchoring the resonator body to the substrate comprises:
extending an anchoring body of the resonator body from a central vibration nodal point of the resonator body in an out-of-plane direction relative to the resonator body to anchor the resonator body to the substrate.

20. The method of claim 15, wherein anchoring the resonator body to the substrate comprises:
anchoring the resonator body to the substrate via four anchoring bodies of the resonator body.

* * * * *